(12) United States Patent
Wang et al.

(10) Patent No.: US 12,278,303 B1
(45) Date of Patent: Apr. 15, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhao Wang, Haining (CN); Hao Jin, Haining (CN); Mengchao Shen, Haining (CN); Jiajia Zhu, Haining (CN); Jie Yang, Haining (CN); Xinyu Zhang, Haining (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/582,627

(22) Filed: Feb. 20, 2024

(30) Foreign Application Priority Data

Dec. 15, 2023 (CN) .......................... 202311738973.0

(51) Int. Cl.
*H01L 31/068* (2012.01)
*H01L 31/0224* (2006.01)
*H01L 31/0236* (2006.01)

(52) U.S. Cl.
CPC .... *H01L 31/068* (2013.01); *H01L 31/022425* (2013.01); *H01L 31/02363* (2013.01)

(58) Field of Classification Search
CPC ........... H01L 31/068; H01L 31/022425; H01L 31/02363
See application file for complete search history.

(56) References Cited

U.S. PATENT DOCUMENTS 6,114,046 A * 9/2000 Hanoka ................. H01L 31/048
156/99
9,525,083 B2 12/2016 Westerberg et al.
(Continued)

FOREIGN PATENT DOCUMENTS

AU 2022206808 B1 11/2023
AU 2023258335 A1 11/2023
(Continued)

OTHER PUBLICATIONS

Andrea Ingenito, et al., "Silicon Solar Cell Architecture with Front Selective and Rear Full Area Ion-Implanted Passivating Contacts", Solar RRL, 2017, vol. 1, Article No. 1700040, 6 pgs.
(Continued)

*Primary Examiner* — Tamir Ayad
(74) *Attorney, Agent, or Firm* — USCH Law, PC

(57) ABSTRACT

A solar cell is provided, including a substrate having a first surface and a second surface, a first dielectric layer formed on the first surface, a first doped polysilicon layer formed on the first dielectric layer, a second dielectric layer formed on the second surface, a second doped polysilicon layer formed on the second dielectric layer, a first passivation layer formed on the first doped polysilicon layer, a second passivation layer formed on the second doped polysilicon layer, first electrodes and second electrodes. The first doped polysilicon layer is doped with an N-type doping element and has a surface having a first roughness, the second doped polysilicon layer is doped with a P-type doping element and has a surface having a second roughness, and the second roughness is less than the first roughness.

14 Claims, 6 Drawing Sheets

(56) References Cited

U.S. PATENT DOCUMENTS

| | | | |
|---|---|---|---|
| 11,848,397 B1* | 12/2023 | Jin | H01L 21/02595 |
| 2009/0308438 A1 | 12/2009 | De Ceuster et al. | |
| 2013/0130508 A1* | 5/2013 | Wu | H01L 21/30604 |
| | | | 252/79.3 |
| 2013/0295712 A1 | 11/2013 | Chen et al. | |
| 2014/0299187 A1* | 10/2014 | Chang | H01L 31/02168 |
| | | | 136/258 |
| 2017/0200850 A1* | 7/2017 | Lee | H01L 31/022441 |
| 2018/0315866 A1 | 11/2018 | Cheong et al. | |
| 2019/0267499 A1 | 8/2019 | Smith et al. | |
| 2020/0135944 A1 | 4/2020 | Yi et al. | |
| 2020/0287066 A1* | 9/2020 | Stodolny | H01L 31/048 |
| 2022/0262967 A1* | 8/2022 | Kim | H01L 31/0368 |
| 2022/0376124 A1 | 11/2022 | Feng et al. | |
| 2023/0037129 A1 | 2/2023 | Prusik et al. | |
| 2023/0187564 A1 | 6/2023 | Jin et al. | |
| 2023/0402553 A1 | 12/2023 | Chen et al. | |

FOREIGN PATENT DOCUMENTS

| | | | | | |
|---|---|---|---|---|---|
| CN | 206595264 U | | 10/2017 | | |
| CN | 108336154 A | | 7/2018 | | |
| CN | 110676160 A | | 1/2020 | | |
| CN | 210897294 U | | 6/2020 | | |
| CN | 111739984 A | | 10/2020 | | |
| CN | 111755552 A | | 10/2020 | | |
| CN | 113327999 A | | 8/2021 | | |
| CN | 114388639 A | | 4/2022 | | |
| CN | 114784148 A | * | 7/2022 | | H01L 21/02381 |
| CN | 115566088 A | | 1/2023 | | |
| CN | 218585994 U | | 3/2023 | | |
| CN | 218975458 U | | 5/2023 | | |
| CN | 116632093 A | | 8/2023 | | |
| CN | 116741849 A | | 9/2023 | | |
| EP | 4290588 A1 | | 12/2023 | | |
| JP | 2005142268 A | | 6/2005 | | |
| JP | 2014204128 A | | 10/2014 | | |
| JP | 2015082512 A | | 4/2015 | | |
| JP | 2015515747 A | | 5/2015 | | |
| JP | 2015149500 A | | 8/2015 | | |
| JP | 2015185587 A | | 10/2015 | | |
| JP | 2016006907 A | | 1/2016 | | |
| JP | 2016012687 A | | 1/2016 | | |
| JP | 2016139834 A | | 8/2016 | | |
| JP | 2016225627 A | | 12/2016 | | |
| JP | 2017120906 A | | 7/2017 | | |
| JP | 2017520920 A | | 7/2017 | | |
| JP | 2018026574 A | | 2/2018 | | |
| JP | 2018107480 A | | 7/2018 | | |
| JP | 2018129511 A | | 8/2018 | | |
| JP | 2019220725 A | | 12/2019 | | |
| JP | 2020043255 A | | 3/2020 | | |
| JP | 2020129666 A | | 8/2020 | | |
| JP | 2022501837 A | | 1/2022 | | |
| JP | 2022058069 A | | 4/2022 | | |
| JP | 7381687 B1 | | 11/2023 | | |
| JP | 2023174428 A | | 12/2023 | | |
| KR | 101740523 B1 | | 5/2017 | | |
| KR | 101930640 B1 | | 12/2018 | | |
| WO | 2015141326 A1 | | 9/2015 | | |
| WO | 2017163520 A1 | | 9/2017 | | |
| WO | WO-2019116031 A1 | * | 6/2019 | | H01L 31/0725 |
| WO | 2019163646 A1 | | 8/2019 | | |

OTHER PUBLICATIONS

Zhejiang Jinko Solar Co., Ltd., et al., Extended European Search Report, EP 24159209.6, Aug. 19, 2024, 73 pgs.

Zhejiang Jinko Solar Co., Ltd., et al., Extended European Search Report, EP 24160410.7, Jul. 23, 2024, 9 pgs.

Zhejiang Jinko Solar Co., Ltd., et al., Notice of Allowance, U.S. Appl. No. 18/424,563, Jul. 31, 2024, 15 pgs.

Zhejiang Jinko Solar Co., Ltd., et al., Extended European Search Report, EP 24153724.0, Aug. 16, 2024, 7 pgs.

Zhejiang Jinko Solar Co., Ltd., et al., Non-Final Rejection, U.S. Appl. No. 18/593,812, Sep. 10, 2024, 35 pgs.

Zhejiang Jinko Solar Co., Ltd., et al., Extended European Search Report, EP 24170779.3, Oct. 4, 2024, 40 pgs.

* cited by examiner

# SOLAR CELL AND PHOTOVOLTAIC MODULE

CROSS-REFERENCE TO RELATED APPLICATION

The present application claims the benefit of priority under the Paris Convention to Chinese Patent Application 202311738973.0 filed on Dec. 15, 2023, which is incorporated herein by reference in its entirety.

TECHNICAL FIELD

Embodiments of the present disclosure relate in general to the field of solar cells, and in particular to a solar cell and a photovoltaic module.

BACKGROUND

Currently, with gradual depletion of fossil energy sources, solar cells are being used more and more widely as a new energy alternative, which convert light energy from the sun into electrical energy. The solar cells utilize the photovoltaic principle to generate carriers, and then use electrodes to draw the carriers out, thereby facilitating efficient utilization of the electrical energy.

Conventional solar cells mainly include interdigitated back contact (IBC) cells, tunnel oxide passivated contact (TOPCON) cells, passivated emitter and rear cells (PERC), and heterojunction cells, etc. The photovoltaic conversion efficiency of the solar cell is improved by reducing optical losses and photogenerated carrier recombination on a surface and in a body of a silicon substrate through configuration of different layers and functional limitations.

However, the photovoltaic conversion efficiency of the conventional solar cell is still poor.

SUMMARY

Some embodiments of the present disclosure provide a solar cell and a photovoltaic module, which are at least conducive to photoelectric conversion efficiency of the solar cell.

Some embodiments of the present disclosure provide a solar cell, including: a substrate having a first surface and a second surface opposite to each other; a first dielectric layer formed on the first surface; a first doped polysilicon layer formed on the first dielectric layer, where the first doped polysilicon layer is doped with an N-type doping element and has a surface facing away from the first dielectric layer and having a first roughness; a second dielectric layer formed on the second surface; a second doped polysilicon layer formed on the second dielectric layer, where the second doped polysilicon layer is doped with a P-type doping element and has a surface facing away from the second dielectric layer and having a second roughness, and where the second roughness is less than the first roughness; a first passivation layer formed on the first doped polysilicon layer; a second passivation layer formed on the second doped polysilicon layer; first electrodes penetrating the first passivation layer to be electrically connected to the first doped polysilicon layer; and second electrodes penetrating the second passivation layer to be electrically connected to the second doped polysilicon layer.

In some embodiments, the first doped polysilicon layer includes a plurality of first silicon grains, and surfaces of the plurality of first silicon grains form the surface of the first doped polysilicon layer having the first roughness; where the second doped polysilicon layer includes a plurality of second silicon grains, and surfaces of the plurality of second silicon grains form the surface of the second doped polysilicon layer having the second roughness; and where each of the plurality of first silicon grains has a grain size that is less than a grain size of any of the plurality of second silicon grains.

In some embodiments, the grain size of each of the plurality of first silicon grains is in a range of 10 nm to 300 nm.

In some embodiments, the grain size of each of the plurality of second silicon grains is in a range of 100 nm to 900 nm.

In some embodiments, the plurality of first silicon grains have spherical granular shapes or spheroidal granular shapes.

In some embodiments, the plurality of second silicon grains have sheet shapes, plate shapes, or granular shapes.

In some embodiments, each of the plurality of first silicon grains has a radial one-dimensional size that is less than a radial one-dimensional size of any of the plurality of the second silicon grains, and each of the plurality of first silicon grains has a height that is greater than a height of any of the plurality of second silicon grains.

In some embodiments, the solar cell includes electrode regions and non-electrode regions which are alternatingly arranged, the first dielectric layer and the first doped polysilicon layer are formed in the electrode regions, and the first passivation layer is formed in the electrode regions and the non-electrode regions; where the first surface has first textured structures in the electrode regions, and the first dielectric layer is formed on the first textured structures; and where the first surface has second textured structures in the non-electrode regions, and the first passivation layer is further formed on the second textured structures.

In some embodiments, a respective one of the first textured structures and the second surface have a first minimum distance, a respective one of the second textured structures and the second surface have a second minimum distance, and the first minimum distance is greater than the second minimum distance.

In some embodiments, the solar cell includes electrode regions and non-electrode regions which are alternatingly arranged, the second dielectric layer and the second doped polysilicon layer are formed in the electrode regions, and the second passivation layer is formed in the electrode regions and the non-electrode regions; where the second surface has first textured structures in the electrode regions, and the second dielectric layer is formed on the first textured structures; and where the second surface has second textured structures in the non-electrode regions, and the second passivation layer is further formed on the second textured structures.

In some embodiments, a respective one of the first textured structures and the first surface have a first minimum distance, a respective one of the second textured structures and the first surface have a second minimum distance, and the first minimum distance is greater than the second minimum distance.

In some embodiments, the first minimum distance and the second minimum distance have a difference in a range of 0.5 μm to 10 μm.

In some embodiments, the first surface further has third textured structures at a junction of a respective electrode region of the electrode regions and a respective non-electrode of the non-electrode regions, and some of the third` surface structures include a first side surface and a second side surface; where the first side surface faces the respective electrode region, and the first dielectric layer is formed on the first side surface; and where the second side surface faces the respective non-electrode region, and the first side surface has a radial length that is less than a radial length of the second side surface.

In some embodiments, the third textured structures include prism structures, pyramid structures, or tetrahedral structures.

In some embodiments, the first textured structures and the second textured structures include platform protrusion structures or pyramid textured structures.

In some embodiments, the first surface is a front surface, and the substrate is doped with the N-type doping element.

In some embodiments, the first doped polysilicon layer has an average thickness that is less than or equal to an average thickness of the second doped polysilicon layer.

In some embodiments, at least one of the first dielectric layer and the second dielectric layer includes silicon oxide, amorphous silicon, microcrystalline silicon, nanocrystalline silicon or silicon carbide.

Some embodiments of the present disclosure further provide a photovoltaic module including: at least one cell string each formed by connecting a plurality of solar cells according to any one of the above embodiments through at least one connecting member; at least one encapsulation layer each configured to cover a surface of a respective cell string; and at least one cover plate each configured to cover a surface of a respective encapsulating adhesive film facing away from the respective cell string.

BRIEF DESCRIPTION OF THE DRAWINGS

One or more embodiments are exemplarily described with figures in the accompanying drawings corresponding thereto, which are not intended to limit these embodiments. Unless otherwise stated, the figures in the accompanying drawings do not constitute scale limitations. In order to more clearly illustrate the technical solutions in the embodiments of the present disclosure or conventional technologies, the accompanying drawings that need to be used in the embodiments are briefly described below, and it is apparent that the drawings in the following description are merely some embodiments of the present disclosure. For a person of ordinary skill in the art, other drawings may also be obtained according to these drawings.

DETAILED DESCRIPTION OF THE EMBODIMENTS

It is seen from the background that the photoelectric conversion efficiency of the conventional solar cell is poor.

Embodiments of the present disclosure provide a solar cell and a photovoltaic module. The solar cell includes a first doped polysilicon layer and a second doped polysilicon layer, the first doped polysilicon layer is formed over a first surface, and the second doped polysilicon layer is formed over a second surface. Such a fully-passivated contact cell structure greatly reduces recombination current of the cell and improves open-circuit voltage of the cell. In addition, the process of preparing the fully-passivated contact cell uses the first doped polysilicon layer and the second doped polysilicon layer as carrier transport layers without the design of a high-temperature diffusion layer, which removes the influence of the recombination current of the diffusion layer, and improves the open-circuit voltage of the cell. The first doped polysilicon layer is doped with N-type doping elements, and a surface of the first doped polysilicon layer has a first roughness. The second doped polysilicon layer is doped with P-type doping elements, and a surface of the second doped polysilicon layer has a second roughness. The second roughness is less than the first roughness. In this way, the first doped polysilicon layer and the second doped polysilicon layer have different morphologies, and for the first doped polysilicon layer with higher roughness, the surface of the first doped polysilicon layer improves internal reflection of incident light and reduces optical loss of the solar cell. The first doped polysilicon layer further improves a contact area between the first electrode and the first doped polysilicon layer, thereby improving contact performance and welding tension of the first doped polysilicon layer. For the second doped polysilicon layer with lower roughness, the surface of the second doped polysilicon layer is smooth, uniformity of the second passivation layer deposited on the second doped polysilicon layer is good, and passivation performance of the second passivation layer is good, so that the problem of recombination defects of the solar cell is improved.

Embodiments of the present disclosure will be described in detail below with reference to the accompanying drawings. Those of ordinary skill in the art may understand that in the embodiments of the present disclosure, many technical details are set forth in order to make the reader better understand the present disclosure. The technical solutions set forth in the present disclosure may be implemented even without these technical details and various changes and modifications based on the following embodiments.

Figure 1:
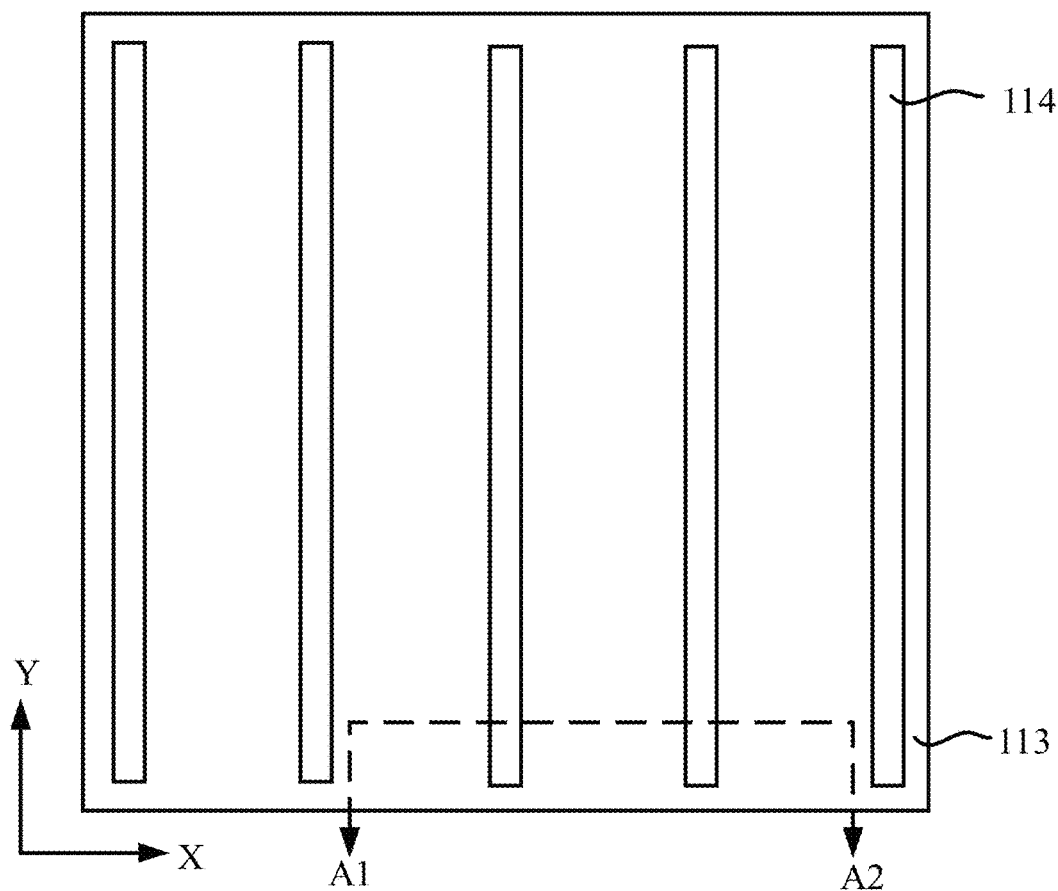
FIG. 1 is a schematic structural diagram of a solar cell according to an embodiment of the present disclosure.
Figure 2:
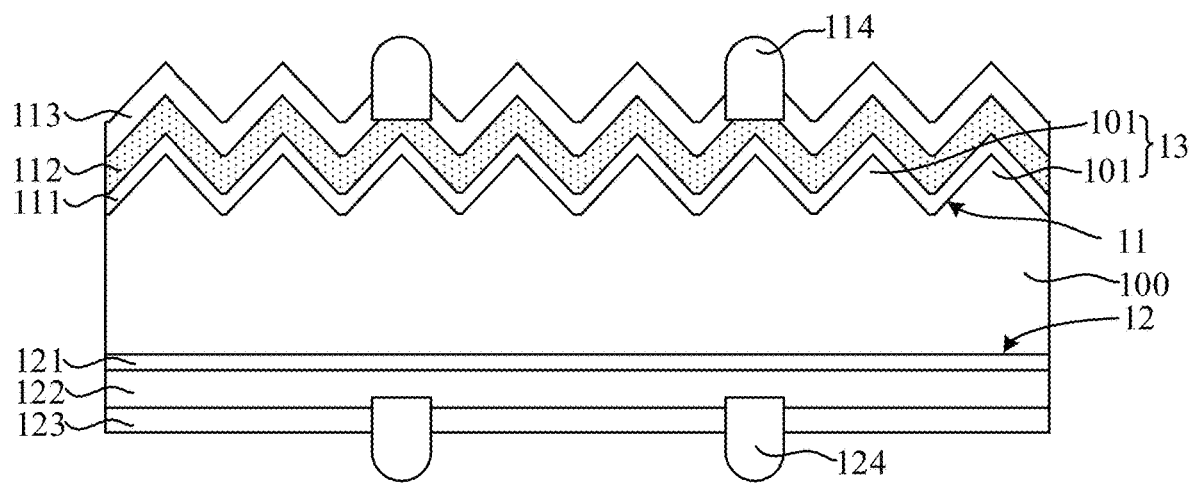
FIG. 2 is a cross-sectional view of FIG. 1 along section line A1-A2.
Figure 3:
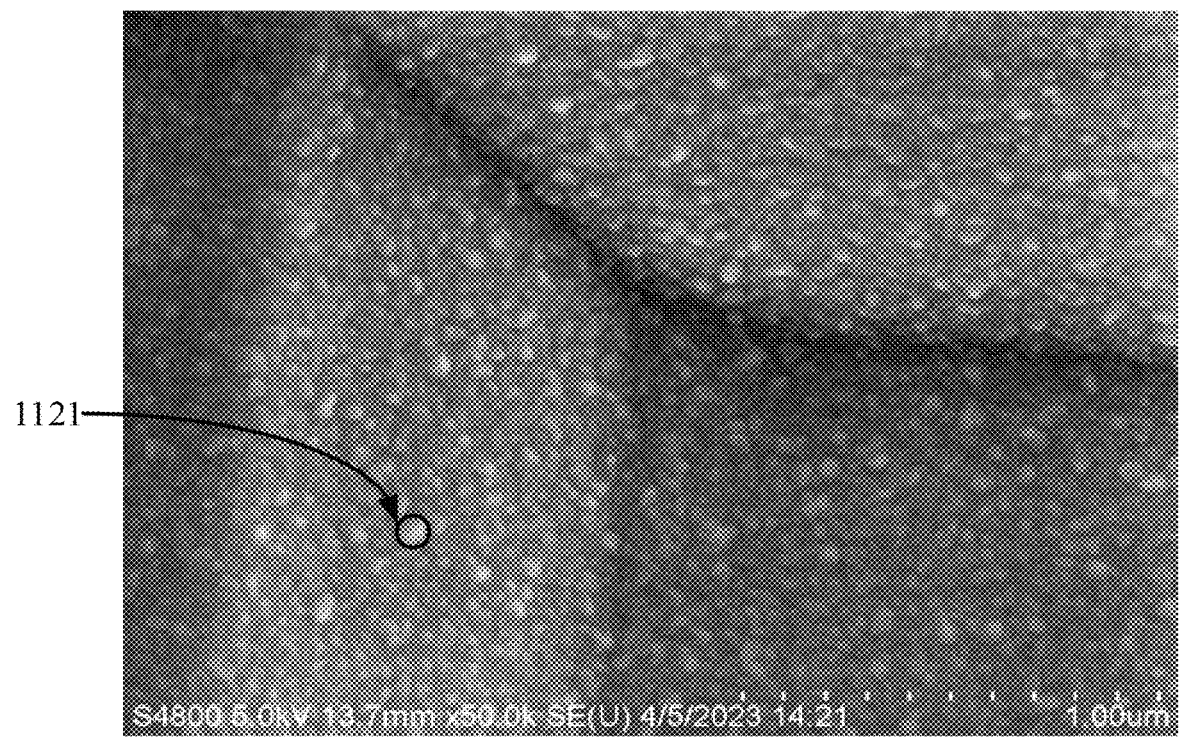
FIG. 3 is a scanning electron microscope image of a first doped polysilicon layer in a solar cell according to an embodiment of the present disclosure.
Figure 4:
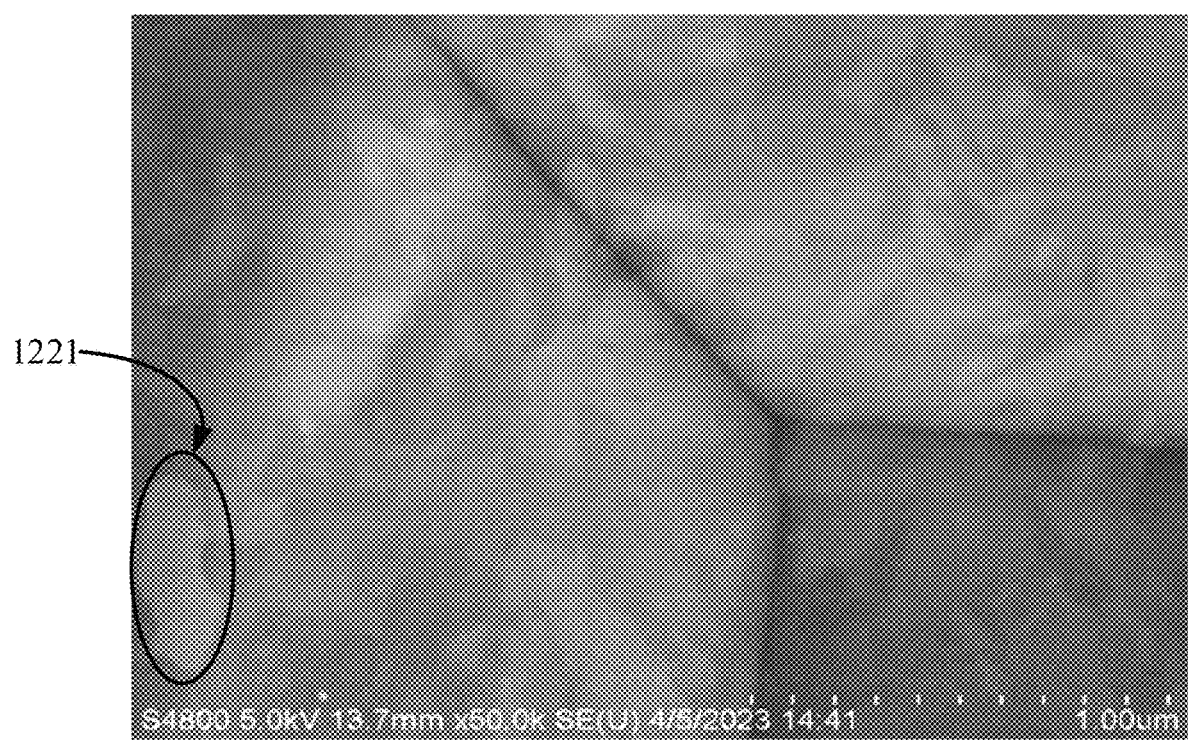
FIG. 4 is a scanning electron microscope image of a second doped polysilicon layer in a solar cell according to an embodiment of the present disclosure.

FIG. 1 is a schematic structural diagram of a solar cell according to an embodiment of the present disclosure. FIG. 2 is a cross-sectional view of FIG. 1 along section line A1-A2. FIG. 3 is a scanning electron microscope image of a first doped polysilicon layer in a solar cell according to an embodiment of the present disclosure. FIG. 4 is a scanning electron microscope image of a second doped polysilicon layer in a solar cell according to an embodiment of the present disclosure.

Referring to FIG. 1 and FIG. 2, some embodiments of the present disclosure provide a solar cell for improving photoelectric conversion efficiency. The solar cell includes a substrate 100 having a first surface 11 and a second surface 12 disposed opposite to each other.

In some embodiments, a material of the substrate 100 includes an elemental semiconductor material. Specifically, the elemental semiconductor material is composed of a single element, for example, silicon or germanium. The elemental semiconductor material may be in a single crystal state, a polycrystalline state, an amorphous state, or a microcrystalline state (i.e., having the single crystal state and the amorphous state at the same time). For example, silicon may be at least one of single crystalline silicon, polysilicon, amorphous silicon, or microcrystalline silicon.

In some embodiments, the material of the substrate 100 includes a compound semiconductor material. Conventional compound semiconductor materials include, but are not limited to, silicon germanium, silicon carbide, gallium arsenide, indium gallium arsenide, perovskite, cadmium telluride, copper indium selenium and other materials. The substrate 100 may also be a sapphire substrate, a silicon substrate on an insulator, or a germanium substrate on the insulator.

In some embodiments, the substrate 100 may be an N-type semiconductor substrate or a P-type semiconductor substrate. The N-type semiconductor substrate is doped with an N-type doping element, and the N-type doping element may be any one of group V elements such as phosphorus (P), bismuth (Bi), antimony (Sb), or arsenic (As). The P-type semiconductor substrate is doped with a P-type doping element, and the P-type doping element may be any one of group III elements such as boron (B), aluminum (Al), gallium (Ga), or indium (In).

In some embodiments, the first surface 11 of the substrate 100 is a front surface and the second surface 12 is a rear surface, or, the first surface 11 of the substrate 100 is the rear surface and the second surface 12 is the front surface. The front surface is a light receiving surface for receiving incident light, and the rear surface is a backlight surface. In some embodiments, the solar cell is a double-sided cell, that is, both the first surface and the second surface of the substrate are light receiving surfaces for receiving incident light. The backlight surface is also capable of receiving incident light, but the efficiency of receiving the incident light from the backlight surface is weaker than the efficiency of receiving the incident light from the light receiving surface.

Figure 6:
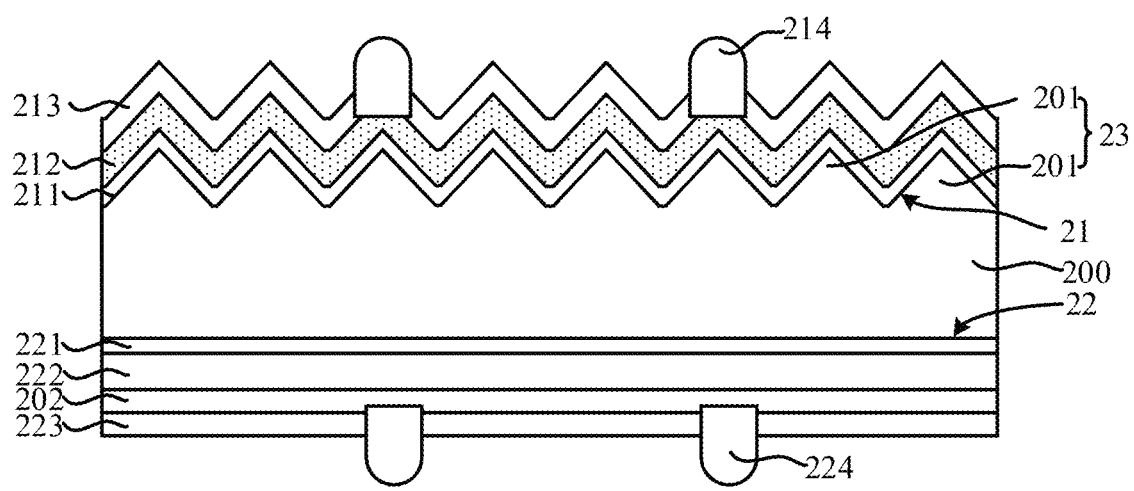
FIG. 6 is a cross-sectional view of FIG. 5 along section line A1-A2.
Figure 8:
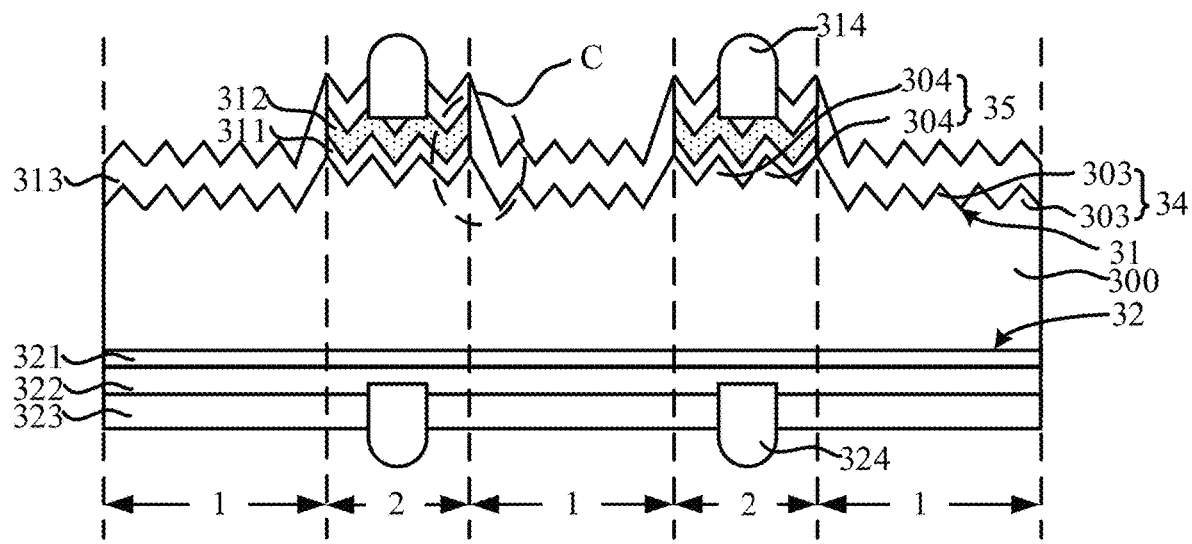
FIG. 8 is a cross-sectional view of FIG. 7 along section line A1-A2.

In the solar cell shown in FIG. 2, FIG. 6 and FIG. 8, the first surface of the substrate is the front surface, and the second surface of the substrate is the rear surface. That is, improvements are made on the front surface of the solar cell so as to reduce parasitic absorption of the front surface of the solar cell, and improvements are made on the rear surface of the solar cell so as to improve passivation performance of the rear surface of the solar cell. In the solar cell shown in FIG. 2, FIG. 6, and FIG. 8, a surface of the substrate facing upward side serves as a light receiving surface, and a surface of the substrate facing downward serves as a backlight surface.

It should be noted that, as examples, a first surface of the substrate in the solar cell shown in FIG. 2, FIG. 6, and FIG. 8 is the front surface, and a second surface of the substrate in the solar cell shown in FIG. 2, FIG. 6, and FIG. 8 is the rear surface. Some embodiments of the present disclosure further provide a solar cell having a first surface being the rear surface and a second surface being the front surface.

Referring to FIG. 2, the solar cell includes a first dielectric layer 111 formed on the first surface 11 and a first doped polysilicon layer 112 formed on the first dielectric layer 111. The first doped polysilicon layer 112 is doped with an N-type doping element, and a surface of the first doped polysilicon layer 112 facing away from the first dielectric layer 111 has a first roughness.

In some embodiments, a material of the first dielectric layer 111 includes silicon oxide, amorphous silicon, microcrystalline silicon, nanocrystalline silicon, or silicon carbide.

In some embodiments, the first dielectric layer 111 includes a first tunneling dielectric layer, and a passivation contact structure is formed between the first tunneling dielectric layer and the first doped polysilicon layer 112. The first doped polysilicon layer 112 is able to form band bending on the surface of the substrate 100, and the first tunneling dielectric layer causes an asymmetric shift of the band on the surface of the substrate 100 such that potential barrier for the majority carriers is lower than potential barrier for the minority carriers, therefore the majority carriers can pass through the first tunneling dielectric layer for quantum tunneling more easily, while the minority carriers have difficulty in passing through the first tunneling dielectric layer, so as to achieve selective transport of carriers.

In addition, the first tunneling dielectric layer has a chemical passivation effect. Specifically, as interface state defects exist at an interface of the substrate 100 and the first tunneling dielectric layer, interface state density of the front surface of the substrate 100 is large, the increase of the interface state density promotes recombination of photon-generated carriers, and increases the filling factor, the short-circuit current and the open-circuit voltage of the solar cell, so that the photoelectric conversion efficiency of the solar cell is improved. The first tunneling dielectric layer is provided on the first surface 11 of the substrate 100, so that the first tunneling dielectric layer has the chemical passivation effect on the rear surface of the substrate 100. Specifically, the defect state density of the substrate 100 is reduced by saturating dangling bonds of the substrate 100, and the carrier recombination rate is reduced by reducing the recombination center of the substrate 100.

The first doped polysilicon layer 112 has a field passivation effect. Specifically, an electrostatic field directed to the interior of the substrate 100 is formed on the surface of the substrate 100 to enable minority carriers to escape from the interface, so that concentration of the minority carriers is reduced, the carrier recombination rate at the interface of the substrate 100 is reduced, the open-circuit voltage, the short-circuit current and the filling factor of the solar cell are increased, and the photoelectric conversion efficiency of the solar cell is improved.

The first doped polysilicon layer 112 is doped with the doping element of the same type as the doping element in the substrate 100, for example, the type of the doping element in the substrate 100 is N-type.

A concentration of the doping element in the first doped polysilicon layer 112 is greater than a concentration of the doping element in the substrate 100, so as to form a sufficiently high potential barrier on the surface of the substrate 100, so that the majority carriers in the substrate 100 are able to pass through the first tunneling dielectric layer to the first doped polysilicon layer 112.

In some embodiments, the first doped polysilicon layer 112 is doped with the doping element of a conductivity type different from the doping element in the substrate 100. For example, the type of the doping element in the substrate 100 is P-type, and the type of the doping element in the first doped polysilicon layer 112 is N-type. In this way, a PN junction is constructed between the first doped polysilicon layer 112 and the substrate 100, and new hole-electron pairs are formed by the sun shining on the PN junction. The photo-generated holes flow to the P-type region under the action of a built-in electric field of the P-N junction, the photo-generated electrons flow to the N-type region, and a current is generated after the circuit is connected.

In some embodiments, a thickness of the first tunneling dielectric layer is in a range of 0.5 nm to 5 nm. The thickness of the first tunneling dielectric layer is in a range of 0.5 nm to 1.3 nm, 1.3 nm to 2.6 nm, 2.6 nm to 4.1 nm, or 4.1 nm to 5 nm. If the first tunneling dielectric layer is within any of the above ranges, the thickness of the first tunneling dielectric layer is relatively small, so that the majority carriers can pass through the first tunneling dielectric layer more easily for quantum tunneling, and the minority carriers have difficulty in passing through the first tunneling dielectric layer, so as to realize selective transmission of carriers. In some embodiments, a thickness of the first doped polysilicon layer 112 is in a range of 10 nm to 300 nm. Optionally, the thickness of the first doped polysilicon layer 112 is in a range of 10 nm to 60 nm, or 60 nm to 130 nm, 130 nm to 250 nm, or 250 nm to 300 nm.

Referring to FIG. 3, the first doped polysilicon layer 112 includes a plurality of first silicon grains 1121, and surfaces of the plurality of first silicon grains 1121 form a surface of the first doped polysilicon layer 112 having a first roughness.

It should be noted that in the process of forming the first doped polysilicon layer 112, silicon atoms are arranged in the form of a diamond lattice to form a plurality of crystal nucleuses, the crystal nucleuses grow into grains having crystal planes with different orientations, and the grains are combined to crystallize into polysilicon. The first silicon grains refer to grains having crystal planes with different orientations which constitute the polysilicon.

From the scanning electron microscope image shown in FIG. 3, a surface morphology of the first doped polysilicon layer 112 is directly seen, the first doped polysilicon layer 112 includes the plurality of first silicon grains 1121, surfaces of the plurality of first silicon grains 1121 are uneven so as to construct an uneven surface of the first doped polysilicon layer 112, so the surface of the first doped polysilicon layer 112 has the first roughness.

In some embodiments, a grain size of a first silicon grain 1121 is in a range of 10 nm to 300 nm. The grain size of the first silicon grain is in a range of 10 nm to 53 nm, 53 nm to 95.3 nm, 95.3 nm to 138.2 nm, 138.2 nm to 200.6 nm, 200.6 nm to 248 nm, or 248 nm to 300 nm. The grain size of the first silicon grain 1121 is within any of the above ranges, so that the roughness of the surface formed by surfaces of the first silicon grains 1121 is large. The grain size of the first silicon grain 1121 is within any of the above ranges, the stability between the first silicon grain 1121 and the first silicon grain 1121 is good, and the first doped polysilicon layer 112 is not prone to deformation of the crystal state. In addition, if the grain size of the first silicon grain 1121 is within any of the above ranges, the stress of the first doped polysilicon layer 112 on the first dielectric layer 111 and a first passivation layer is small, so that film layer performance between the first doped polysilicon layer 112 and the first dielectric layer 111 and between the first doped polysilicon layer 112 and the first passivation layer is improved.

In some embodiments, the shape of the first silicon grain 1121 includes a granular shape. Compared with a block-shaped structure, grain boundaries between granular structures are few, and space between the grain boundaries is large. The N-type doping element in the first doped polysilicon layer 112 can migrate through the space between the grain boundaries and is finally collected by the first electrode.

In some embodiments, the granular shape includes a spherical granular shape or a spheroidal granular shape.

It should be noted that the shape of the first silicon grain as well as a shape of a second silicon grain in the following description is observed by an electrical microscope or an optical microscope, etc., with magnification, and the electrical microscope may include a scanning electron microscope (SEM) or an atomic force microscope (AFM) of conventional testing means. FIG. 3 is a micrograph of a first silicon grain shown by the scanning electrical microscope, and it is seen that the first silicon grain has a granular shape with the same length in three dimensions. FIG. 4 is a micrograph of a second silicon grain shown by the scanning electrical microscope, and it is seen that the second silicon grain has a sheet shape extending in two dimensions.

With reference to FIG. 2, the solar cell includes a second dielectric layer 121 formed on the second surface and a second doped polysilicon layer 122 formed on the second dielectric layer 121, and the second doped polysilicon layer 122 is doped with a P-type doping element. A surface of the second doped polysilicon layer 122 facing away from the second dielectric layer 121 has a second roughness, and the second roughness is less than the first roughness.

In some embodiments, a material of the second dielectric layer 121 includes silicon oxide, amorphous silicon, microcrystalline silicon, nanocrystalline silicon, or silicon carbide.

In some embodiments, the second dielectric layer 121 includes a second tunneling dielectric layer, and a passivation contact structure is formed between the second tunneling dielectric layer and the second doped polysilicon layer 122. The second doped polysilicon layer 122 is able to form band bending on the surface of the substrate 100, and the second tunneling dielectric layer causes an asymmetric shift of the band on the surface of the substrate 100 such that potential barrier for the majority carriers is lower than potential barrier for the minority carriers, therefore the majority carriers can pass through the second tunneling dielectric layer for quantum tunneling more easily, while the minority carriers have difficulty in passing through the second tunneling dielectric layer, so as to achieve selective transport of carriers.

In addition, the second tunneling dielectric layer has a chemical passivation effect. Specifically, as interface state defects exist at an interface of the substrate 100 and the second tunneling dielectric layer, interface state density of the rear surface of the substrate 100 is large, the increase of the interface state density promotes recombination of photon-generated carriers, and increases the filling factor, the short-circuit current and the open-circuit voltage of the solar cell, so that the photoelectric conversion efficiency of the solar cell is improved. The second tunneling dielectric layer is provided on the second surface 12 of the substrate 100, so that the second tunneling dielectric layer has the chemical passivation effect on the rear surface of the substrate 100. Specifically, the defect state density of the substrate 100 is reduced by saturating dangling bonds of the substrate 100, and the carrier recombination rate is reduced by reducing the recombination center of the substrate 100.

The second doped polysilicon layer 122 has a field passivation effect. Specifically, an electrostatic field directed to the interior of the substrate 100 is formed on the surface of the substrate 100 to enable minority carriers to escape from the interface, so that concentration of the minority carriers is reduced, the carrier recombination rate at the interface of the substrate 100 is reduced, the open-circuit voltage, the short-circuit current and the filling factor of the solar cell are increased, and the photoelectric conversion efficiency of the solar cell is improved.

The second doped polysilicon layer 122 is doped with the doping element of the same type as the doping element in the substrate 100, for example, the type of the doping element in the substrate 100 is P-type.

A concentration of the doping element in the second doped polysilicon layer 122 is greater than a concentration of the doping element in the substrate 100, so as to form a sufficiently high potential barrier on the surface of the substrate 100, so that the majority carriers in the substrate 100 are able to pass through the second tunneling dielectric layer to the second doped polysilicon layer 122.

In some embodiments, a thickness of the second tunneling dielectric layer is in a range of 0.5 nm to 5 nm. The thickness of the second tunneling dielectric layer is in a range of 0.5 nm to 1.3 nm, 1.3 nm to 2.6 nm, 2.6 nm to 4.1 nm, or 4.1 nm to 5 nm. If the second tunneling dielectric layer is within any of the above ranges, the thickness of the second tunneling dielectric layer is relatively small, so that the majority carriers can pass through the second tunneling dielectric layer more easily for quantum tunneling, and the minority carriers have difficulty in passing through the second tunneling dielectric layer, so as to realize selective transmission of carriers.

For the solar cell shown in FIG. 2, in some embodiments, the first doped polysilicon layer 112 is doped with the doping element of a conductivity type that is different from a conductivity type of the doping element in the substrate 100, a PN junction is formed between the first doped polysilicon layer 112 and the substrate 100, and the first doped polysilicon layer 112 serves as an emitter. In some embodiments, the second doped polysilicon layer 122 is doped with the doping element of a conductivity type that is different from the conductivity type of the doping element in the substrate 100, a PN junction is formed between the second doped polysilicon layer 122 and the substrate 100, and the second doped polysilicon layer 122 serves as the emitter.

Figure 5:
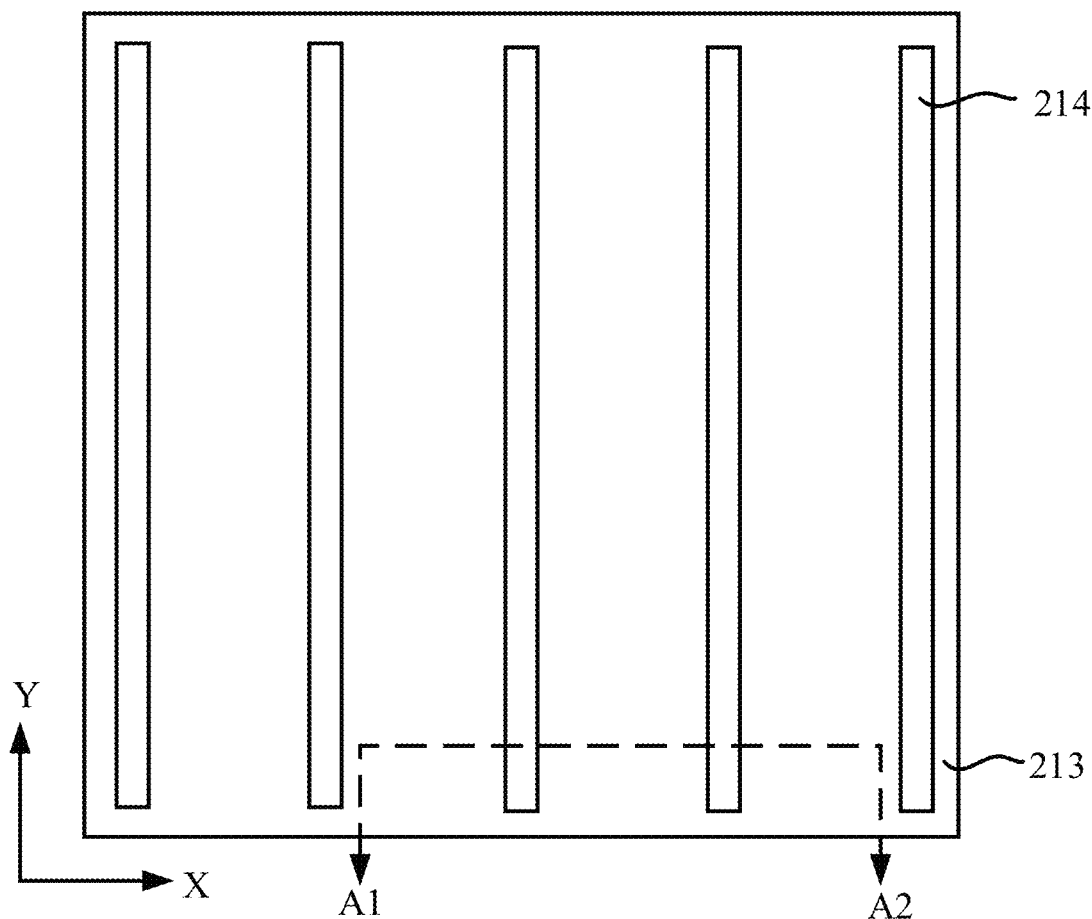
FIG. 5 is another schematic structural diagram of a solar cell according to an embodiment of the present disclosure.

FIG. 5 is a schematic structural diagram of a solar cell according to an embodiment of the present disclosure, and FIG. 6 is a schematic cross-sectional view of FIG. 5 along section line A1-A2.

In some embodiments, referring to FIG. 6, the second dielectric layer 221 includes an intrinsic dielectric layer, and a heterojunction structure is formed between the intrinsic dielectric layer and the substrate. The intrinsic dielectric layer has a good passivation effect on the surface of the substrate, recombination of carriers is greatly avoided, and long lifetime of the minority carriers and high open-circuit voltage are achieved.

A material of the intrinsic dielectric layer includes intrinsic amorphous silicon, intrinsic microcrystalline silicon, intrinsic silicon oxide, intrinsic nanocrystalline silicon or intrinsic silicon carbide. An optional range of a thickness of the first intrinsic dielectric layer is greater than or equal to 2 microns, less than or equal to 10 microns, and preferably 5 microns. In some cases, due to the influence of diffusion of other film layers prepared subsequently or doping process conditions, the intrinsic dielectric layer may include a small amount of doping elements, but the intrinsic dielectric layer with a small amount of doping elements is still regarded as a dielectric layer of an intrinsic type.

In some embodiments, a thickness of the second doped polysilicon layer 222 is in a range of 20 nm to 500 nm. Further, the thickness of the second doped polysilicon layer 222 is in a range of 200 nm to 400 nm. In some embodiments, the thickness of the second doped polysilicon layer 222 is in a range of 20 nm to 103 nm, 103 nm to 139 nm, 139 nm to 161 nm, 161 nm to 218 nm, 218 nm to 298 nm, or 298 nm to 500 nm.

In some embodiments, referring to FIG. 6, the solar cell further includes a transparent conductive layer 202 formed on the second doped polysilicon layer 222 and second electrodes 224 in electrical contact with the transparent conductive layer 202.

In some embodiments, a material of the transparent conductive layer 202 includes at least one of indium tin oxide (ITO), aluminum doped zinc oxide (AZO), cerium doped indium oxide, and tungsten doped indium oxide.

For the solar cell shown in FIG. 6, in some embodiments, the first doped polysilicon layer 212 is doped with the doping element of a conductivity type that is different from a conductivity type of the doping element in the substrate 200, a PN junction is formed between the first doped polysilicon layer 212 and the substrate 200, and the first doped polysilicon layer 212 serves as an emitter. In some embodiments, the second doped polysilicon layer 222 is doped with the doping element of a conductivity type that is different from a conductivity type of the doping element in the substrate 200, a PN junction is formed between the second doped polysilicon layer 222 and the substrate 200, and the second doped polysilicon layer 222 serves as the emitter. When the PN junction is formed between the second doped polysilicon layer 222 and the substrate 200, the intrinsic dielectric layer is provided between the PN junction to serve as a buffer layer, and the intrinsic dielectric layer has a good passivation effect on the surface of the substrate 200, so that recombination of carriers is greatly avoided, and relatively long lifetime of the minority carriers and high open-circuit voltage are realized.

With continued reference to FIG. 2 and FIG. 4, the second doped polysilicon layer 122 includes a plurality of second silicon grains 1221, and surfaces of the plurality of second silicon grains 1221 form a surface of the second doped polysilicon layer 122 having a second roughness. A grain size of the first silicon grain 1121 is less than a grain size of the second silicon grain 1221.

In some embodiments, "roughness" in "first roughness" and "second roughness" refers to an arithmetic mean of absolute values of vertical deviations of a crest and a trough relative to an average horizontal line set in a sampling length. The roughness may be measured by comparison measurement, light-sectioning measurement, interference measurement, and stylographic measurement.

In some embodiments, the grain size of the second silicon grain 1221 is in a range of 100 nm to 900 nm. The grain size of the second silicon grain 1221 may be in a range of 100 nm to 250 nm, 250 nm to 360 nm, 360 nm to 490 nm, 490 nm to 584 nm, 584 nm to 610 nm, 610 nm to 790 nm, or 790 nm to 900 nm. When the grain size of the second silicon grain 1221 is within any of the above ranges, a grain boundary between the second silicon grain 1221 and the second silicon grain 1221 is small, and carriers can easily pass through the second doped polysilicon layer 122, thereby improving the carrier migration rate and facilitating the improvement of the cell efficiency.

In some embodiments, the second silicon grain 1221 has a sheet shape, a plate shape, or a granular shape. A microstructure of the second silicon grain shown in FIG. 4 is in the sheet shape.

FIG. 3 and FIG. 4 show surface morphologies of the first doped polysilicon layer 112 and the second doped polysilicon layer 122 at the same magnification, respectively. As is seen from FIG. 3 and FIG. 4, the surface of the first doped polysilicon layer 112 is rougher than the surface of the second doped polysilicon layer 122, that is, the first roughness is greater than the second roughness. In this way, based on different morphologies of the first doped polysilicon layer 112 and the second doped polysilicon layer 122, for the first doped polysilicon layer 112 with higher roughness, the surface of the first doped polysilicon layer 112 improves the internal reflection of incident light and reduces the optical loss of the solar cell. The first doped polysilicon layer 112 further improves the contact area between the first electrode and the first doped polysilicon layer 112, thereby improving the contact performance and the welding tension of the first doped polysilicon layer 112. For the second doped polysilicon layer 122 with lower roughness, the surface of the second doped polysilicon layer 122 is smooth, the uniformity of the second passivation layer deposited on the second doped polysilicon layer 122 is good, and the passivation performance of the second passivation layer is good, so that the problem of recombination defects of the solar cell is improved.

In some embodiments, the grain size of the first silicon grain 1121 being less than the grain size of the second silicon grain 1221 includes that a radial one-dimensional size of the first silicon grain 1121 is smaller than a radial one-dimensional size of the second silicon grain 1221, and a height of the first silicon grain 1121 is greater than a height of the second silicon grain 1221. In this way, the roughness of the first doped polysilicon layer 112 formed by the first silicon grains 1121 is greater than the roughness of the second doped polysilicon layer 122 formed by the second silicon grains 1221.

The radial one-dimensional size of the first silicon grain 1121 refers to a length of an average line (or diameter) of the first silicon grain 1121. The height of the first silicon grain 1121 refers to a distance between a side of the first silicon grain 1121 close to the first dielectric layer 111 and a side of the first silicon grain 1121 away from the first dielectric layer 111.

Similarly, the radial one-dimensional size of the second silicon grain 1221 refers to a length of an average line (or diameter) of the second silicon grain 1221. The height of the second silicon grain 1221 refers to a distance between a side of the second silicon grain 1221 close to the second dielectric layer 121 and a side of the second silicon grain 1221 away from the second dielectric layer 121.

In some embodiments, the first silicon grain 1121 has a granular shape with the same length in three dimensions, and the height of the first silicon grain 1121 is equal to the length of the average line of the first silicon grain 1121. The second silicon grain 1221 has the sheet shape extending in two dimensions, and the height of the second silicon grain 1221 is less than the length of the average line of the second silicon grain 1221. The height of the second silicon grain 1221 is a length of a line in a direction of a non-extending surface.

A size of a grain is referred to as the grain size. Conventional representations include a number of grains per volume (ZV), a number of grains per unit area (ZS), or a length of an average line (or diameter) of the grain. The length of the average line of the grain refers to a length of a line of an extension surface in an extension direction of the grain. The grain size in this embodiment of the present disclosure may be the length of the average line of the grain.

In some embodiments, an average thickness of the first doped polysilicon layer 112 is less than or equal to an average thickness of the second doped polysilicon layer 122. In this way, the average thickness of the first doped polysilicon layer 112 formed over the front surface is small, which reduces parasitic absorption of the first doped polysilicon layer 112 to the incident light irradiated onto the front surface. The average thickness of the second doped polysilicon layer 122 formed over the rear surface is large, which reduces the risk of the P-type doping element diffusing into the substrate caused by the second electrode burning through the second doped polysilicon layer 122 due to the fact that the second doped polysilicon layer 122 is too thin, so that the problem that the P-type doping element in the second doped polysilicon layer 122 is accumulated at the interface of the substrate to form a 'dead layer' is avoided, the carrier transport efficiency is improved, and the generation of the carrier recombination center is reduced.

With continued reference to FIG. 2, the solar cell further includes a first passivation layer 113 formed on the first doped polysilicon layer 112, a second passivation layer 123 formed on the second doped polysilicon layer 122, first electrodes 114 penetrating the first passivation layer 113 to be electrically connected to the first doped polysilicon layer 112, and second electrodes 124 penetrating the second passivation layer 123 to be electrically connected to the second doped polysilicon layer 122.

In some embodiments, the first passivation layer 113 may be a single-layer structure or a laminated structure, and a material of the first passivation layer 113 includes at least one of silicon oxide, silicon nitride, silicon oxynitride, silicon carbonitride oxide, titanium oxide, hafnium oxide, or aluminum oxide, etc.

In some embodiments, the second passivation layer 123 may be a single-layer structure or a laminated structure, and a material of the second passivation layer 123 includes at least one of silicon oxide, silicon nitride, silicon oxynitride, silicon carbonitride oxide, titanium oxide, hafnium oxide, or aluminum oxide, etc.

In some embodiments, a material of the first passivation layer 113 is the same as that of the second passivation layer 123, and the first passivation layer 113 and the second passivation layer 123 can be prepared in the same process.

In some embodiments, a distance between a first electrode 114 and a first electrode 114 that are adjacent to each other in a first direction X is in a range of 0.5 mm to 2 mm. The distance between the first electrode 114 and the first electrode 114 in the first direction X is in a range of 0.5 mm to 0.8 mm, 0.8 mm to 1.15 mm, 1.15 mm to 1.28 mm, 1.28 mm to 1.46 mm, 1.46 mm to 1.68 mm, 1.68 mm to 1.84 mm, or 1.84 mm to 2 mm.

In some embodiments, a width of the first electrode 114 in the first direction X is in a range of 5 μm to 50 μm. The width of the first electrode 114 in the first direction X is in a range of 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the first electrode 114 is sintered from burn-through paste. A method for forming the first electrode 114 includes printing metal paste on a surface of a portion of the first passivation layer 113 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the first passivation layer 113 in the sintering process, thereby the metal paste permeates in the first passivation layer 113 so as to be in electrical contact with the first doped polysilicon layer 112.

In some embodiments, an orthographic projection of the second electrode 124 on the second surface overlaps an orthographic projection of the first electrode 114 on the second surface, and a distance between a second electrode and a second electrode that are adjacent to each other in the first direction X is in a range of 0.5 mm to 2 mm. A width of the second electrode 124 in the first direction X is in a range of 5 μm to 50 μm.

In some embodiments, the second electrode 124 is sintered from burn-through paste. The method for forming the second electrode 124 includes printing metal paste on a surface of a portion of the second passivation layer 123 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the second passivation layer 123 in the sintering process, thereby the metal paste permeates in the second passivation layer 123 so as to be in electrical contact with the second doped polysilicon layer 122.

Referring to FIG. 6, a method for forming a second electrode 224 includes printing metal paste on a surface of a portion of the second passivation layer 223 using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the second passivation layer 223 in the sintering process, so that the metal paste permeates in the second passivation layer 223 so as to be in electrical contact with the transparent conductive layer 202.

In some embodiments, a material of the first electrode 114 is the same as that of the second electrode 124, and the first electrode 114 and the second electrode 124 are prepared in the same process.

In some embodiments, with reference to FIG. 2, the first surface 11 of substrate 100 includes an original textured structure 13, and the first surface 11 is a surface with a concave-convex structure, which improves the utilization of light by the solar cell by increasing the internal reflection of the incident light, thereby improving the photoelectric conversion efficiency of the solar cell.

In some embodiments, the original textured structure 13 includes a plurality of protrusion structures 101, which may have pyramid shapes, parabola shapes, or elliptic sphere shapes.

In some examples, as shown in FIG. 2, the first surface is the front surface, and the substrate is doped with the N-type doping element. An N-type cell, compared with a P-type cell, has advantages of high conversion rate, low temperature coefficient, high double-sided rate, long lifetime of carriers and the like. The first doped polysilicon layer 112 is formed over the front surface of the solar cell, and the second doped polysilicon layer 122 is formed over the rear surface of the solar cell. A doping type of the second doped polysilicon layer 122 is different from that of the substrate. A PN junction is formed between the substrate and the second doped polysilicon layer 122, so that a conventional front-junction cell is replaced by a rear-junction cell, which reduces recombination efficiency of incident light on the front surface as well as recombination defects of the substrate. The first roughness of the first doped polysilicon layer 112 is large, so that a concave-convex degree of the front surface is large, so that the incident light is reflected to a greater extent, which improves the internal reflection of the solar cell, thereby improving the photoelectric conversion efficiency of the solar cell. The second roughness of the second doped polysilicon layer 122 is small, so that the film layer performance of the second passivation layer deposited on the second doped polysilicon layer 122 is good, the passivation performance of the second passivation layer is improved, and the cell efficiency is further improved.

The description of the substrate 200, the first passivation layer 213, the first dielectric layer 211, the first doped polysilicon layer 212, the original textured structure 23, the protrusion structures 201, the first electrodes 214, the first surface 21, and the second surface 22 in FIG. 6 is able to refer to the description of the substrate 100, the first passivation layer 113, the first dielectric layer 111, the first doped polysilicon layer 112, the original textured structure 13, the protrusion structures 101, the first electrodes 114, the first surface 11 and the second surface 12 in FIG. 2, which is not repeated herein.

In the solar cell provided in the embodiments of the present disclosure, the solar cell includes the first doped polysilicon layer 112 formed over the first surface and the second doped polysilicon layer 122 formed over the second surface, such a fully-passivated contact cell structure greatly reduces the recombination current of the cell, and improves the open-circuit voltage of the cell. In addition, the process of preparing the fully-passivated contact cell uses the first doped polysilicon layer 112 and the second doped polysilicon layer 122 as the carrier transport layers without the design of the high-temperature diffusion layer, which removes the influence of the recombination current of the diffusion layer, and improves the open-circuit voltage of the cell. The first doped polysilicon layer 112 is doped with N-type doping elements, and a surface of the first doped polysilicon layer 112 has a first roughness. The second doped polysilicon layer 122 is doped with P-type doping elements, and a surface of the second doped polysilicon layer 122 has a second roughness, and the second roughness is less than the first roughness. In this way, the first doped polysilicon layer 112 and the second doped polysilicon layer 122 have different morphologies, and for the first doped polysilicon layer 112 with higher roughness, the surface of the first doped polysilicon layer 112 improves the internal reflection of incident light and reduces the optical loss of the solar cell. The first doped polysilicon layer 112 further improves the contact area between the first electrode and the first doped polysilicon layer 112, thereby improving the contact performance and the welding tension of the first doped polysilicon layer 112. For the second doped polysilicon layer 122 with lower roughness, the surface of the second doped polysilicon layer 122 is smooth, the uniformity of the second passivation layer deposited on the second doped polysilicon layer 122 is good, and the passivation performance of the second passivation layer is good, so that the problem of recombination defects of the solar cell is improved.

Figure 7:
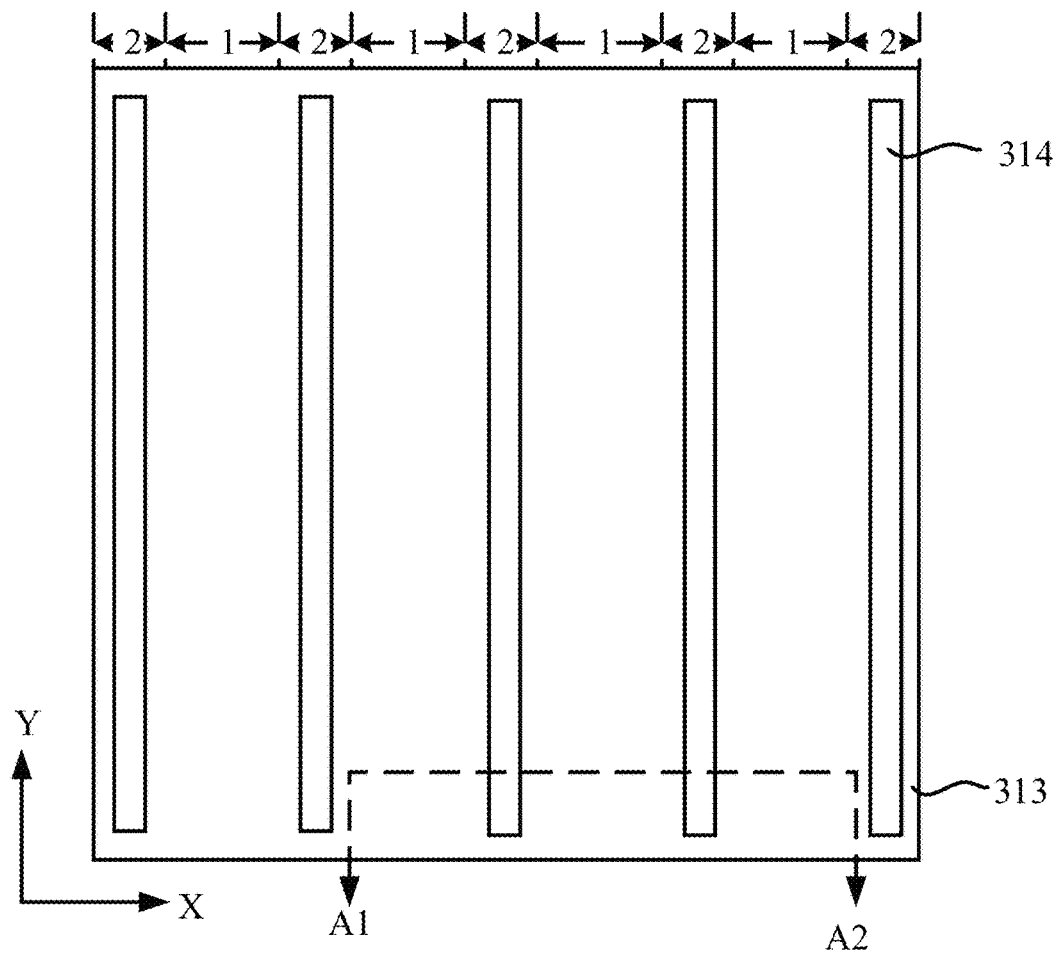
FIG. 7 is yet another schematic structural diagram of a solar cell according to an embodiment of the present disclosure.
Figure 9:
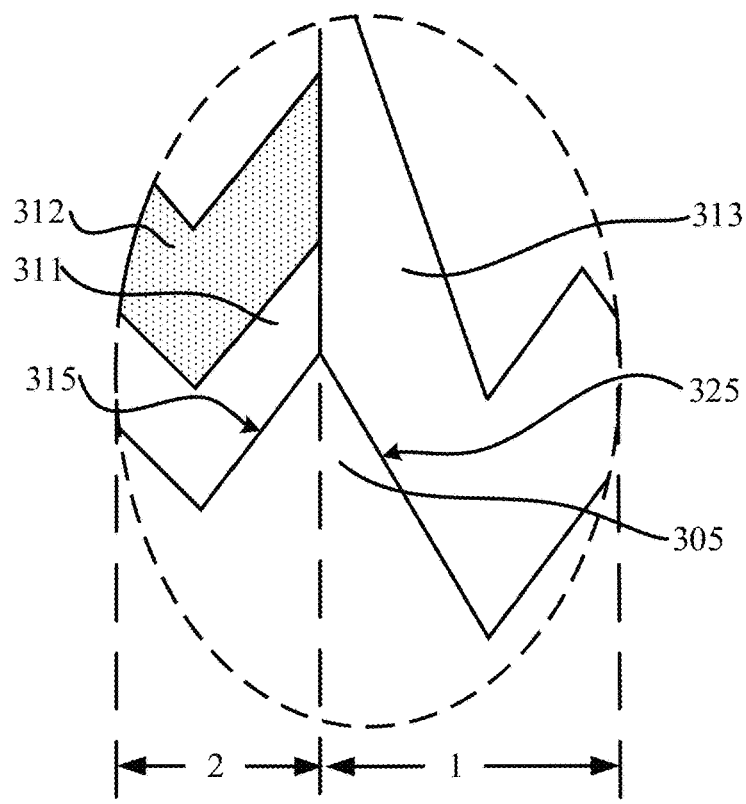
FIG. 9 is a partial enlarged view of part C in FIG. 8.
Figure 10:
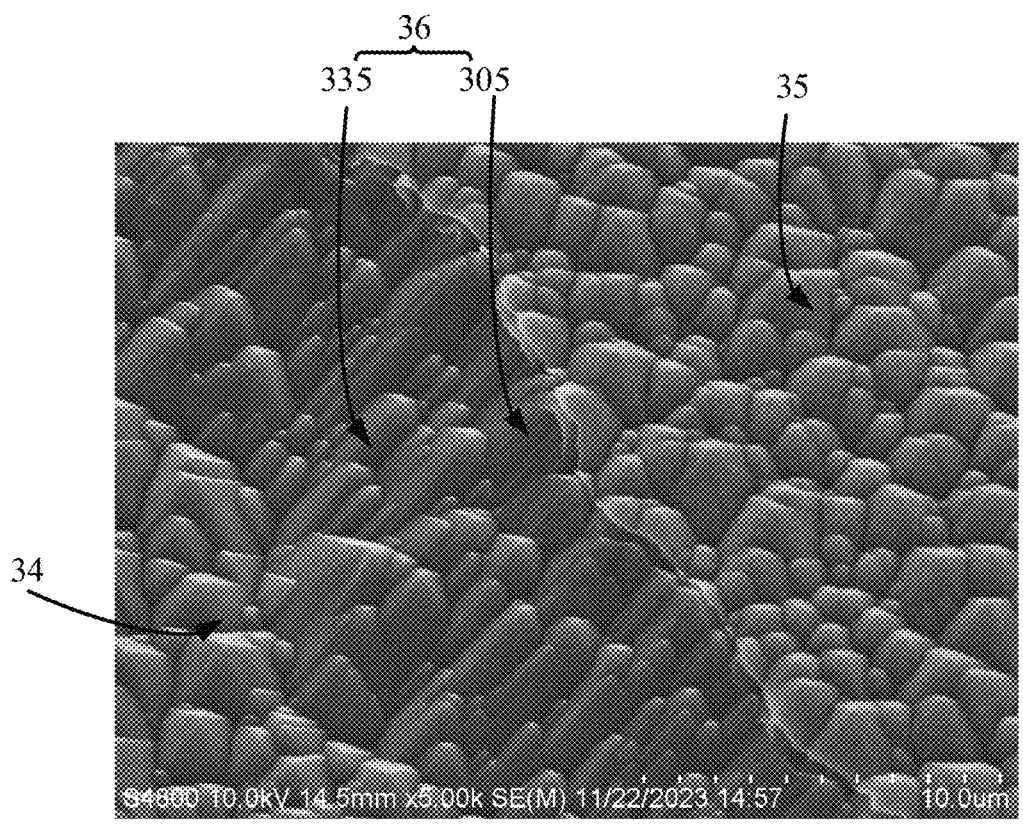
FIG. 10 is a first scanning electron microscope image of a junction of an electrode region and a non-electrode region in FIG. 8.
Figure 11:
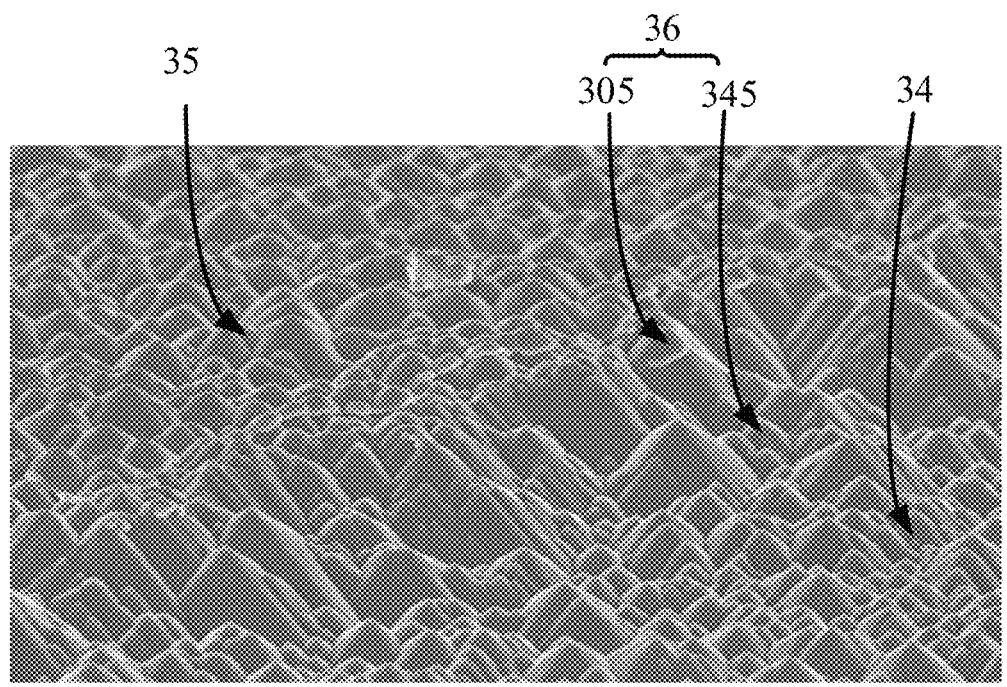
FIG. 11 is a second scanning electron microscope image of the junction of the electrode region and the non-electrode region in FIG. 8.

FIG. 7 is yet another schematic structural diagram of a solar cell according to an embodiment of the present disclosure, FIG. 8 is a cross-sectional view of FIG. 7 along section line A1-A2, FIG. 9 is a partial enlarged view of part C in FIG. 8, FIG. 10 is a first scanning electron microscope image of a junction of an electrode region and a non-electrode region in FIG. 8, and FIG. 11 is a second scanning electron microscope image of the junction of the electrode region and the non-electrode region in FIG. 8.

Correspondingly, some embodiments of the present disclosure further provide a solar cell, which differs from the above embodiments in that the solar cell includes electrode regions and non-electrode regions, and the first surface has first textured structures in the electrode regions and second textured structures in the non-electrode regions. Some of the structures of the solar cell the same as those in the above embodiments are not repeated herein.

Referring to FIG. 8, the solar cell includes a substrate 300 having a first surface 31 and a second surface 32 disposed opposite to each other, a first dielectric layer 311 formed on the first surface 31, a first doped polysilicon layer 312 formed on the first dielectric layer 311, a second dielectric layer 321 formed on the second surface 32, a second doped polysilicon layer 322 formed on the second dielectric layer 321, a first passivation layer 313 formed on the first doped polysilicon layer 312, a second passivation layer 323 formed on the second doped polysilicon layer 322, first electrodes 314 penetrating the first passivation layer 313 to be electrically connected to the first doped polysilicon layer 312, and second electrodes 324 penetrating the second passivation layer 323 to be electrically connected to the second doped polysilicon layer 322. The first doped polysilicon layer 312 is doped with an N-type doping element, and a surface of the first doped polysilicon layer 312 facing away from the first dielectric layer 311 has a first roughness. The second doped polysilicon layer 322 is doped with a P-type doping element, a surface of the second doped polysilicon layer 322 facing away from the second dielectric layer 321 has a second roughness, and the second roughness is less than the first roughness.

Referring to FIG. 8 or FIG. 10, the solar cell includes electrode regions 2 and non-electrode regions 1 which are alternatingly arranged, the first dielectric layer 311 and the first doped polysilicon layer 312 are formed in the electrode regions, and the first passivation layer 313 is formed in the electrode regions 2 and the non-electrode regions 1.

In some embodiments, the electrode regions 2 refer to regions of the substrate 300 aligned with the first electrodes 314 or the second electrodes 324 in a thickness direction of the substrate 300, or may be understood as regions where orthographic projections of the first electrodes 314 on the substrate 300 are located or regions where orthographic projections of the second electrodes 324 on the substrate 300 is located. Conversely, regions of the substrate 300 unaligned with the first electrodes 314 and the second electrodes 324 are the non-electrode regions 1. An area of an electrode area 2 is greater than or equal to an orthographic projection of the first electrode 314 or the second electrode 324 on the substrate 300, thereby ensuring that all the regions with which the first electrodes 314 or the second electrodes 324 are in contact are the electrode regions 2.

In some embodiments, a width of the electrode region is 1 to 5 times a width of the first electrode. If the width of the electrode region is too large, the integrity and uniformity of films on the non-electrode region 1 may be affected, and the internal reflection of the light is reduced, which is not conducive to improving the recombination rate of the carriers on surface and the photoelectric conversion efficiency of the solar cell. A perpendicular bisector of the electrode region may overlap with a central axis of the first electrode or deviate from the central axis of the first electrode by 5%.

In some embodiments, the first surface 31 has first textured structures 35 in the electrode regions 2, and the first dielectric layer 311 is formed on the first textured structures 35. The first surface 31 has second textured structures 34 in the non-electrode regions 1, and the first passivation layer 313 is further formed on the second textured structures 34.

In some embodiments, a minimum distance between a first textured structure 35 and a second surface 32 of the substrate is a first minimum distance, a minimum distance between a second textured structure 34 and the second surface 32 is a second minimum distance, and the first minimum distance is greater than the second minimum distance.

The minimum distance between the first textured structure 35 and the second surface 32 refers to a distance between a portion of the first textured structure closest to the second surface 32 and the second surface 32. The minimum distance between the second textured structure 34 and the second surface 32 refers to a distance between a portion of the second textured structure closest to the second surface 32 and the second surface 32.

In some embodiments, a difference between the first minimum distance and the second minimum distance is in a range of 0.5 μm to 10 μm. The difference between the first distance and the second distance is in a range of 0.5 μm to 2 μm, 2 μm to 3.8 μm, 3.8 μm to 6.9 μm, 6.9 μm to 7.6 μm, 7.6 μm to 8.3 μm, or 8.3 μm to 10 μm.

In some embodiments, the first textured structure 35 includes a plurality of first protrusion structures 304 arranged at intervals, and in practical application, the arrangement of the plurality of first protrusion structures 304 is not limited. Since the first dielectric layer 311 and the first doped polysilicon layer 312 are thin, the first dielectric layer 311 and the first doped polysilicon layer 312 are able to show morphologies of the first protrusion structures.

In some embodiments, referring to FIG. 8, the second textured structure 34 includes a plurality of second protrusion structures 303. In practical application, the arrangement of the plurality of second protrusion structures 303 is not limited.

In some embodiments, at least one of the first textured structure 35 and the second textured structure 34 includes platform protrusion structures or pyramid textured structures.

In some embodiments, the solar cell includes electrode regions and non-electrode regions which are alternatingly arranged, the second dielectric layer and the second doped polysilicon layer are formed in the electrode regions, and the second passivation layer is formed in the electrode regions and the non-electrode regions. The second surface has first textured structures in the electrode regions, and the second dielectric layer is formed on the first textured structures. The second surface has second textured structures in the non-electrode regions, and the second passivation layer is further formed on the second textured structures.

In some embodiments, a minimum distance between a first textured structure and the first surface is a first minimum distance, a minimum distance between a second textured structure and the first surface is a second minimum distance, and the first distance is greater than the second distance.

In some embodiments, referring to FIG. 9 and FIG. 10, a surface of the substrate 300 further has third textured structures 36 at a junction of a non-electrode region 1 and an electrode region 2. Some of the third textured structures 36 include a first side surface 315 and a second side surface 325. The first side surface 315 faces the electrode region 2, and the first dielectric layer 311 is formed on the first side surface 315. The second side surface 325 faces the non-electrode region 1, and the first side surface 315 has a radial length that is less than a radial length of the second side surface 325.

Referring to FIG. 11, the third textured structure 36 has a plurality of third protrusion structures 305 arranged in an intersecting manner, and the third textured structure 36 further has micro-convex structures 345 in addition to the discrete third protrusion structures 305, so that a probability that incident light incident to the junction of the electrode region and the non-electrode region at different angles is reflected at least once and absorbed by the substrate 300 through the third protrusion structures 305 and/or the micro-convex structures 345 is increased, and a probability that the incident light is reflected at least once and reflected by the third protrusion structures 305 and/or the micro-convex structures 345 to the non-electrode region 1 so as to be absorbed by the non-electrode region 1 is increased, thereby improving the absorption rate of the first surface 31 to the incident light. By improving the problem of serious recombination of carriers in the electrode region 2 and improving the absorption rate of the first surface 31 to the incident light, the photoelectric conversion efficiency of the solar cell is improved.

In some embodiments, the third textured structure 36 includes prism structures, pyramid structures, or tetrahedral structures.

The embodiments of the present disclosure are described in more detail below with reference to the accompanying drawings.

In some embodiments, referring to FIG. 11, a micro-convex structure 345 includes at least one of a prism structure inclined toward the electrode region 2, a second pyramid structure, or a triangular plate-like structure.

It should be noted that, as an example, the micro-convex structure 345 includes the prism structure inclined toward the electrode region 2, the second pyramid structure or the triangular plate-shaped structure as shown in FIG. 11. In practical application, for the third textured structure 36 in the same region, the micro-convex structure 345 may include only one of the second pyramid structure, the triangular plate-shaped structure, or the prism structure inclined toward the electrode region 2, or any two of the three. In addition, the micro-convex structure 345 may be an irregular granular structure in addition to one of the prism structure inclined toward the electrode region 2, the second pyramid structure, or the triangular plate-shaped structure.

Referring to FIG. 11, it should be noted that a one-dimensional size of a bottom of the micro-convex structure 345 includes any one of a length, a width, or a diagonal length of an orthographic projection pattern of the bottom of the micro-convex structure 345 on the substrate 300. In addition, as an example, the orthographic projection pattern of the bottom of the micro-convex structure 345 on the substrate 300 is a regular quadrangle in FIG. 11. In this case, the one-dimensional size of the bottom of the micro-convex structure 345 is any one of a length, a width, or a diagonal length of the regular quadrangle.

In practical application, the orthographic projection pattern of the bottom of the micro-convex structure 345 on the substrate 300 may also be an irregular polygon, and in this case, the length, width or diagonal length of the orthographic projection pattern of the bottom of the micro-convex structure 345 on the substrate 300 is not absolute, but is artificially defined for representing the one-dimensional size of the bottom of the micro-convex structure 345. For example, the orthographic projection pattern of the bottom of the micro-convex structure 345 on the substrate 300 is an irregular quadrangle. In this case, the length of the orthographic projection pattern of the bottom of the micro-convex structure 345 on the substrate 300 may be defined as a length of the longest edge of the irregular quadrangle, the width of the orthographic projection pattern of the bottom of the micro-convex structure 345 on the substrate 300 may be defined as a length of the shortest edge of the irregular quadrangle, and the diagonal length of the orthographic projection pattern of the bottom of the micro-convex structure 345 on the substrate 300 may be defined as a length of the longest diagonal of the irregular quadrangle.

In addition, the orthographic projection pattern of the bottom of the micro-convex structure 345 on the substrate 300 may be, in addition to the irregular quadrangle, other irregular polygons, circles, or irregular shapes similar to a circle. In this case, one-dimensional size of the bottom of the micro-convex structure 345 is measured by selecting a plurality of regions with different specific areas in the bottom of the micro-convex structure 345 and obtaining an average value of lengths, widths, diagonal lengths or diameters of the regions with the different specific areas, where the regions with the specific areas are flexibly defined according to actual requirements.

With continued reference to FIG. 11, it should be noted that the orthographic projection pattern of the bottom of the third protrusion structure 305 on the substrate 300 is generally a regular quadrangle, and in this case, one-dimensional size of the bottom of the third protrusion structure 305 is any one of a length, a width, or a diagonal length of the regular quadrangle. In practical application, the orthographic projection pattern of the bottom of the third protrusion structure 305 on the substrate 300 may be an irregular quadrangle, and the definition of one-dimensional size of the bottom of the third protrusion structure 305 in this case is similar to the definition of one-dimensional size of the orthographic projection pattern of the bottom of the micro-convex structure 345 on the substrate 300 when it is the irregular quadrangle, which is not repeated herein.

In addition, one-dimensional sizes of bottoms of different third protrusion structures 305 may be different or the same, but the one-dimensional sizes of the bottoms of the third protrusion structures 305 are within a numerical range. One-dimensional sizes of bottoms of different micro-convex structures 345 may be different or the same, but the one-dimensional sizes of the bottoms of the third protrusion structures 305 are also within a numerical range. The one-dimensional size of the bottom of the micro-convex structure 345 being smaller than that of the bottom of the third protrusion structure 305 means that an average value of the one-dimensional sizes of the bottoms of the plurality of micro-convex structures 345 is smaller than an average value of the one-dimensional sizes of the bottoms of the plurality of third protrusion structures 305.

Specific characteristics of the prism structures are described in detail below.

In some embodiments, referring to FIG. 11, the prism structures are located on side surfaces of the third protrusion structures 305. The following two arrangements of the prism structures on the side surfaces of the third protrusion structures 305 are provided. In some cases, one prism structure is located on a side surface of one third protrusion structure 305. In other cases, a plurality of prism structures are attached to the same side surface of one third protrusion structure 305, and each prism structure is in contact and connection with the side surface.

In some embodiments, with continued reference to FIG. 11, some of the prism structures are located at a portion of the junction adjacent to the electrode region 2. For example, the prism structures are located between the third protrusion structures 305 and the electrode region 2.

In some embodiments, the plurality of prism structures are sequentially arranged in a direction away from the side surface of the third protrusion structure 305. For example, only the prism structure closest to the side surface of the third protrusion structure 305 among the plurality of prism structures is in contact and connection with the side surface of the third protrusion structure 305.

It should be noted that the plurality of prism structures at the same junction include at least one of the prism structures described in the above three kind of embodiments, that is, the plurality of prism structures at the same junction may have the characteristics of the prism structures in the above three kind of embodiments, or have the characteristics of the prism structures in any two of the above three kind of embodiments, or have the characteristics of the prism structures in any one of the above three kind of embodiments.

Specific characteristics of the second pyramid structures are described in detail below.

In some embodiments, a bottom of the second pyramid structure is in contact and connection with the bottom of the third protrusion structure 305. In some cases, a periphery of the bottom of one third protrusion structure 305 is surrounded with a plurality of second pyramid structures, and the bottom of each second pyramid structure is in contact and connection with the bottom of the third protrusion structure 305.

In some embodiments, at least one second pyramid structure is located at the interval between two adjacent third protrusion structures 305. In other words, the bottom of the second pyramid structure is not in contact and connection with the bottom of the third protrusion structure 305.

It should be noted that the second pyramid structures at the same junction include the second pyramid structures in at least one of the above two kind of embodiments, that is, the plurality of second pyramid structures at the same junction may have the characteristics of the second pyramid structures in the above two kind of embodiments, or have the characteristics of the second pyramid structures in any one of the above two kind of embodiments.

Specific characteristics of the triangular plate-like structures are described in detail below.

In some embodiments, one triangular plate-like structure is located on a side surface of one third protrusion structure 305 in some cases, and in other cases, a plurality of triangular plate-like structures are attached to the same side surface of one third protrusion structure 305, and each triangular plate-like structure is in contact and connection with the side surface.

In some embodiments, the plurality of triangular plate-like structures are sequentially arranged in a direction away from the side surface of the third protrusion structure 305. For example, only the triangular plate-like structure closest to the side surface of the third protrusion structure 305 among the plurality of triangular plate-like structures is in contact and connection with the side surface of the third protrusion structure 305.

It should be noted that the triangular plate-like structures at the same junction include the triangular plate-like structures in at least one of the above two kind of embodiments, that is, the plurality of triangular plate-like structures at the same junction may have the characteristics of the triangular plate-like structures in the above two kind of embodiments, or have the characteristics of the triangular plate-like structures in any one of the above two kind of embodiments.

In some embodiments, the third protrusion structure 305 is located at a portion of the junction adjacent to the non-electrode region 1. In other words, there are more typical third protrusion structures 305 at the portion of the junction adjacent to the non-electrode region 1.

It should be noted that, the third textured structures 36 at the junction are described in various embodiments, i.e., the structure of the third textured structure 36 has diversity. In some cases, the plurality of micro-convex structures 345 are also provided at the same junction at which the third protrusion structures 305 are provided, and the specific characteristics of the plurality of micro-convex structures 345 at different junctions may be different. For example, one of two adjacent junctions has the prism structures inclined toward the electrode region 2 and the second pyramid structures, and the other has the second pyramid structures and the triangular plate-like structures.

Referring to FIG. 10, the third textured structure 36 further includes first prism structures 335, a first length of a third protrusion structure 305 is greater than a second length of a first prism structure 335 in an inclined direction of the first prism structure 335, and at least some of the first prism structures 335 are located on side surfaces of the third protrusion structures 305 away from the electrode region 2. In this way, the probability that the incident light incident to the junction is absorbed by the junction or the non-electrode region 1 is further improved.

It should be noted that in the example shown in FIG. 10, an inclined length of the shortest one of the plurality of third protrusion structures 305 is defined as the first length of the third protrusion structure 305, and an inclined length of the longest one of the plurality of first prism structures 335 is defined as the second length of the first prism structure 335. Based on this, the first length of the third protrusion structure 305 being greater than the second length of the first prism structure 335 refers to that the inclined length of the shortest one of the plurality of third protrusion structures 305 is greater than the inclined length of the longest one of the plurality of first prism structures 335.

In practical application, an average value of inclined lengths of the plurality of third protrusion structures 305 is defined as the first length of the third protrusion structure 305, and an average value of inclined lengths of the plurality of first prism structures 335 is defined as the second length of the first prism structure 335. Based on this, the first length of the third protrusion structure 305 being greater than the second length of the first prism structure 335 refers to that the average value of the inclined lengths of the plurality of third protrusion structures 305 is greater than the average value of the inclined lengths of the plurality of first prism structures 335.

In some embodiments, referring to FIG. 10, two arrangements of the second prism structures 335 on the side surfaces of the third protrusion structures 305 away from the electrode region 2 are provided. In some cases, one second prism structure 335 is located on a side surface of one third protrusion structure 305 away from the electrode region 2. In some cases, the plurality of first prism structures 335 are located on a side surface of one second prism structure 335 away from the electrode region 2, and each first prism structure 335 is in contact and connection with the side surface.

In some embodiments, referring to FIG. 10, the plurality of first prism structures 335 are sequentially arranged in a direction away from the side surface of the third protrusion structure 305. For example, only the first prism structure 335 closest to the side surface of the third protrusion structure 305 among the plurality of first prism structures 335 is in contact and connection with the side surface of the third protrusion structure 305.

In some embodiments, referring to FIG. 10, the third textured structure 36 further includes first pyramid structures, and at least some of the first pyramid structures are located on a portion of the junction.

A one-dimensional size of a bottom of the third protrusion structure is greater than a one-dimensional size of a bottom of the first protrusion structure, and the one-dimensional size of the bottom of the first protrusion structure is greater than a one-dimensional size of a bottom of the second protrusion structure.

It should be noted that the definitions for both the one-dimensional size of the bottom of the first protrusion structure and the one-dimensional size of the bottom of the second protrusion structure are similar to the definition for the one-dimensional size of the bottom of the third protrusion structure described in the above embodiments of the present disclosure, and details are not repeated herein.

In addition, one-dimensional sizes of bottoms of different first protrusion structures may be different or the same, but the one-dimensional sizes of the bottoms of the first protrusion structures are within a numerical range. One-dimensional sizes of bottoms of different second protrusion structures may be different or the same, but the one-dimensional sizes of the bottoms of the second protrusion structures are also within a numerical range. Based on this, the one-dimensional size of the bottom of the third protrusion structure being greater than that of the bottom of the first protrusion structure refers to that an average value of the one-dimensional sizes of the bottoms of the plurality of third protrusion structures is greater than an average value of the one-dimensional sizes of the bottoms of the first protrusion structures, and the one-dimensional size of the bottom of the first protrusion structure is greater than that of the bottom of the second protrusion structure refers to that an average value of the one-dimensional sizes of the bottoms of the plurality of first protrusion structures on which the first doped polysilicon layer is formed is greater than an average value of the one-dimensional sizes of the bottoms of the plurality of second protrusion structures in the non-electrode regions 2.

Moreover, a size relationship between a one-dimensional size of a bottom of a first protrusion structure and a one-dimensional size of a bottom of another first protrusion structure is not limited in the embodiments of the present disclosure, and a size relationship between a one-dimensional size of a bottom of a second protrusion structure and a one-dimensional size of a bottom of another second protrusion structure is not limited in the embodiments of the present disclosure.

Figure 12:
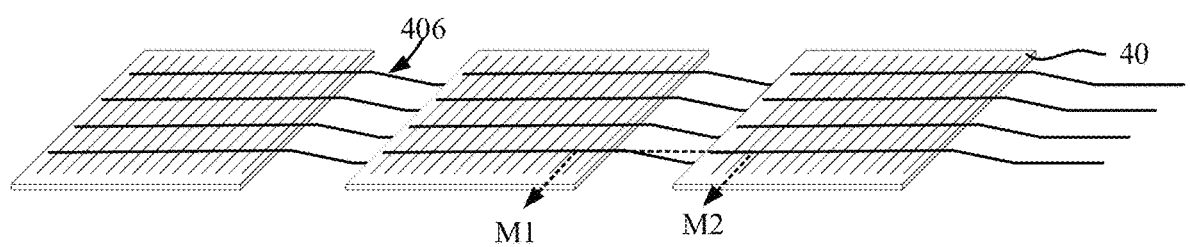
FIG. 12 is a schematic structural diagram of a photovoltaic module according to an embodiment of the present disclosure.
Figure 13:
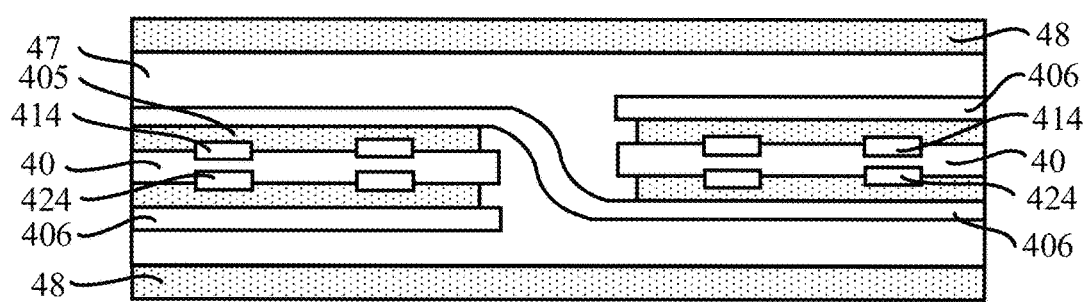
FIG. 13 is a cross-sectional view of FIG. 12 along section line M1-M2.

FIG. 12 is a schematic structural diagram of a photovoltaic module according to an embodiment of the present disclosure. FIG. 13 is a cross-sectional view of FIG. 12 along section line M1-M2.

Correspondingly, some embodiments of the present disclosure provide a photovoltaic module including the solar cell in the above embodiments, and the same parts as those in the above embodiments are not repeated herein.

Referring to FIG. 12, the photovoltaic module includes at least one cell string each formed by connecting a plurality of solar cells 40 according to any one of the above embodiments through at least one connecting member 406, at least one encapsulation layer 47 each configured to cover a surface of a respective cell string, and at least one cover plate 48 each configured to cover a surface of a respective encapsulation layer 47 facing away from the cell string.

Specifically, in some embodiments, the plurality of solar cells are electrically connected by means of the at least one connecting member 406, and the connecting members 406 are welded to busbars 405 on the solar cells. FIG. 12 only shows a positional relationship between solar cells. That is, arrangement directions of the electrodes with the same polarity of the cells are the same, in other words, cells having electrodes with the positive polarity are arranged towards the same side, so that the connecting member is connected to different sides of two adjacent cells. In some embodiments, the cells having electrodes of different polarities may also face the same side, e.g., electrodes of adjacent three cells sequentially have a first polarity, a second polarity and a first polarity, and then the connecting members connect the two adjacent cells on the same side.

In some embodiments, a gap is not provided between the solar cells, that is, the solar cells overlap with each other.

In some embodiments, the at least one connecting member is welded to finger electrodes on the solar cells, and the finger electrodes include first electrodes 414 and second electrodes 424.

In some embodiments, the at least one encapsulation layer includes a first encapsulation layer and a second encapsulation layer, the first encapsulation layer covers one of the front surface or the rear surface of the solar cell, and the second encapsulation layer covers the other of the front surface or the rear surface of the solar cell. Specifically, at least one of the first encapsulation layer or the second encapsulation layer may be an organic encapsulation adhesive film such as polyvinyl butyral (PVB) adhesive film, ethylene-vinyl acetate copolymer (EVA) adhesive film, polyethylene octene co-elastomer (POE) adhesive film or polyethylene terephthalate (PET) adhesive film.

It should be noted that the first encapsulation layer and the second encapsulation layer have a boundary before lamination processing, and the photovoltaic module formed after the lamination processing does not have the so-called first encapsulation layer and second encapsulation layer, that is, the first encapsulation layer and the second encapsulation layer have formed an integral encapsulation layer 47.

In some embodiments, the at least one cover plate 48 may be a cover plate having a light-transmitting function, such as a glass cover plate and a plastic cover plate. Specifically, a surface of the cover plate 48 facing the encapsulation layer 47 may be a concave-convex surface, thereby increasing the utilization rate of incident light. The at least one cover plate 48 includes a first cover plate and a second cover plate, the first cover plate faces the first encapsulation layer and the second cover plate faces the second encapsulation layer, or, the first cover plate faces one side of the solar cell and the second cover plate faces the other side of the solar cell.

Correspondingly, some embodiments of the present disclosure further provide a method for preparing a solar cell, which may be used to prepare the solar cell provided in the above embodiments, and technical features the same as or corresponding to the technical features in the above embodiments are not repeated herein.

The method for preparing the solar cell shown in FIG. 8 is taken as an example.

The method includes providing a substrate and performing polishing treatment on two opposite surfaces of the substrate. The polishing treatment is used to reduce surface defects of the substrate.

In some embodiments, the substrate has electrode regions and non-electrode regions which are alternatingly arranged.

The method includes performing texturing treatment on one of the two opposite surfaces of the substrate, so that the one of the two opposite surfaces of the substrate forms an original textured structure. The texturing treatment includes chemical etching, for example, a mixed solution of potassium hydroxide and hydrogen peroxide may be used to clean the substrate, and specifically, the original textured structure conforming to the expectation can be formed by controlling a ratio of concentration of the potassium hydroxide solution to concentration of the hydrogen peroxide solution. In some embodiments, the original textured structure may also be formed by methods such as laser etching, mechanical or plasma etching. In the laser etching, the original textured structure conforming to the expectation is obtained by controlling laser process parameters.

The method includes forming a first passivation film on the original textured structure and forming a first doped conductive film on the first passivation film.

The method includes forming a second dielectric layer on the other of the two opposite surfaces of the substrate and forming a second doped conductive film on the second dielectric layer.

In some embodiments, both the first doped conductive film and the second doped conductive film may be crystallized at the same time, in which a surface of the first doped conductive film facing away from the first passivation film has a first roughness, and a surface of the second doped conductive film facing away from the second passivation film has a second roughness. The second doped conductive film after crystallization is a second doped polysilicon layer.

In some embodiments, the crystallization process includes annealing or laser activation.

The method includes patterning portions of the first passivation film, the first doped conductive film and the substrate in the non-electrode regions, and the patterning treatment is used to remove the portions of the first passivation film and the first doped conductive film in the non-electrode regions. The remaining first passivation film is a first dielectric layer, and the remaining first doped conductive film is a first doped polysilicon layer.

In some embodiments, before performing the patterning treatment, the method further includes forming mask layers on portions of the surface of the first doped conductive film in the electrode regions, so as to reduce etching damage to the first doped polysilicon layer in the patterning treatment. A material of the mask layer includes organic wax, metal, or a silicon dioxide mask. The mask layer is formed by using a printing process.

In some embodiments, after the first doped polysilicon layer is formed, the mask layer may be removed by using an etching process, and the etching process includes any one of a dry etching process, a wet etching process, or a laser etching process.

In some embodiments, during the patterning treatment, portions of the original textured structure in the non-electrode regions are transformed into the second textured structures, portions of the original textured structure at junctions of the non-electrode regions and the electrode regions are transformed into the third textured structures, and portions of the original textured structure in the electrode regions are first textured structures.

In some embodiments, the patterning treatment includes a wet etching process or a laser etching process. The process parameters of the wet etching process include a reaction solution including an acid solution, and a reaction time in a range of 50 s to 550 s.

In some embodiments, the steps of the wet etching process include (1) using a mixed acid solution containing HF, $HNO_3$, $H_2SO_4$, with mass concentration of 10% to 25%, 5% to 10%, and 2% to 4%, respectively, patterning the surface in the non-metal regions using the mixed acid solution in a screen printing manner with an amount of 0.05 mL/$cm^2$ to 0.8 mL/$cm^2$ and a time for 50 s to 550 s; (2) using deionized water/low-concentration alkali solution (0.5% to 1% NaOH)/low-concentration HCl (2.5% to 3.5%) for alternate cleaning for 2 times after the patterning.

The method includes forming a first passivation layer on the surface of the substrate in the non-electrode regions and on the first doped polysilicon layer.

The method includes forming electrodes arranged in a first direction, and each electrode is formed in a respective electrode region and burns through the first passivation layer to be electrically connected to the first doped polysilicon layer.

In some embodiments, the method includes forming a first passivation layer formed on the first doped polysilicon layer, forming a second passivation layer formed on the second doped polysilicon layer, and forming first electrodes and second electrodes. The first electrodes penetrate the first passivation layer to be electrically connected to the first doped polysilicon layer, and the second electrodes penetrate the second passivation layer to be electrically connected to the second doped polysilicon layer.

Although the present disclosure is disclosed in the above embodiments, and the above embodiments are not intended to limit the claims. A person skilled in the art may make several possible variations and modifications without departing from the concept of the present disclosure, and therefore, the protection scope of the present disclosure shall be subject to the scope defined by the claims of the present disclosure. In addition, the embodiments of the specification and the accompanying drawings in the present disclosure are merely illustrative and do not cover full protection scope of the claims of the present disclosure.

Any person of ordinary skill in the art can understand that the above embodiments are specific embodiments for realizing the present disclosure. In practical application, various changes may be made thereto in form and details without departing from the scope of the present disclosure. Any person skilled in the art may make various changes and modifications without departing from the scope of the present disclosure, and therefore the protection scope of the present disclosure shall be subject to the scope defined in the claims.

What is claimed is:

1. A solar cell, comprising:
    a substrate having a first surface and a second surface opposite to each other;
    a first dielectric layer formed on the first surface;
    a first doped polysilicon layer formed on the first dielectric layer, wherein the first doped polysilicon layer is doped with an N-type doping element and has a surface facing away from the first dielectric layer and having a first roughness;
    a second dielectric layer formed on the second surface;
    a second doped polysilicon layer formed on the second dielectric layer, wherein the second doped polysilicon layer is doped with a P-type doping element and has a surface facing away from the second dielectric layer and having a second roughness, and wherein the second roughness is less than the first roughness;

a first passivation layer formed on the first doped polysilicon layer;

a second passivation layer formed on the second doped polysilicon layer;

first electrodes penetrating the first passivation layer to be electrically connected to the first doped polysilicon layer; and second electrodes penetrating the second passivation layer to be electrically connected to the second doped polysilicon layer;

wherein the first doped polysilicon layer includes a plurality of first silicon grains, and surfaces of the plurality of first silicon grains form the surface of the first doped polysilicon layer having the first roughness, wherein the second doped polysilicon layer includes a plurality of second silicon grains, and surfaces of the plurality of second silicon grains form the surface of the second doped polysilicon layer having the second roughness, and wherein an average line length of the plurality of first silicon grains is less than an average line length of the plurality of second silicon grains; and wherein the solar cell further includes electrode regions and non-electrode regions which are alternatingly arranged, the first dielectric layer and the first doped polysilicon layer are formed in the electrode regions, and the first passivation layer is formed in the electrode regions and the non-electrode regions, wherein the first surface has first textured structures in the electrode regions, and the first dielectric layer is formed on the first textured structures, and wherein the first surface has second textured structures in the non-electrode regions, and the first passivation layer is further formed on the second textured structures.

2. The solar cell according to claim 1, wherein the average line length of the plurality of first silicon grains is in a range of 10 nm to 300 nm.

3. The solar cell according to claim 1, wherein the average line length of the plurality of second silicon grains is in a range of 100 nm to 900 nm.

4. The solar cell according to claim 1, wherein a respective one of the first textured structures and the second surface have a first minimum distance, a respective one of the second textured structures and the second surface have a second minimum distance, and the first minimum distance is greater than the second minimum distance.

5. The solar cell according to claim 1, wherein the second dielectric layer and the second doped polysilicon layer are formed in the electrode regions, and the second passivation layer is formed in the electrode regions and the non-electrode regions, wherein the second surface has the first textured structures in the electrode regions, and the second dielectric layer is formed on the first textured structures, and wherein the second surface has the second textured structures in the non-electrode regions, and the second passivation layer is further formed on the second textured structures.

6. The solar cell according to claim 5, wherein a respective one of the first textured structures and the first surface have a first minimum distance, a respective one of the second textured structures and the first surface have a second minimum distance, and the first minimum distance is greater than the second minimum distance.

7. The solar cell according to claim 4, wherein the first minimum distance and the second minimum distance have a difference in a range of 0.5 μm to 10 μm.

8. The solar cell according to claim 4, wherein the first surface further has third textured structures at a junction of a respective electrode region of the electrode regions and a respective non-electrode region of the non-electrode regions, and some of the third textured structures include a first side surface and a second side surface; wherein the first side surface faces the respective electrode region, and the first dielectric layer is formed on the first side surface; and wherein the second side surface faces the respective non-electrode region, and the first side surface has a radial length that is less than a radial length of the second side surface.

9. The solar cell according to claim 8, wherein the third textured structures include prism structures, pyramid structures, or tetrahedral structures.

10. The solar cell according to claim 4, wherein the first textured structures and the second textured structures include platform protrusion structures or pyramid textured structures.

11. The solar cell according to claim 4, wherein the first surface is a front surface, and the substrate is doped with the N-type doping element.

12. The solar cell according to claim 1, wherein the first doped polysilicon layer has an average thickness that is less than or equal to an average thickness of the second doped polysilicon layer.

13. The solar cell according to claim 1, wherein at least one of the first dielectric layer and the second dielectric layer includes silicon oxide, amorphous silicon, microcrystalline silicon, nanocrystalline silicon or silicon carbide.

14. A photovoltaic module, comprising:
at least one cell string each formed by connecting a plurality of solar cells through at least one connecting member;
at least one encapsulation layer each configured to cover a surface of a respective cell string; and
at least one cover plate each configured to cover a surface of a respective encapsulation layer facing away from the respective cell string; wherein each of the plurality of solar cells includes:
a substrate having a first surface and a second surface opposite to each other;
a first dielectric layer formed on the first surface;
a first doped polysilicon layer formed on the first dielectric layer, wherein the first doped polysilicon layer is doped with an N-type doping element and has a surface facing away from the first dielectric layer and having a first roughness;
a second dielectric layer formed on the second surface;
a second doped polysilicon layer formed on the second dielectric layer, wherein the second doped polysilicon layer is doped with a P-type doping element and has a surface facing away from the second dielectric layer and having a second roughness, and wherein the second roughness is less than the first roughness;
a first passivation layer formed on the first doped polysilicon layer;
a second passivation layer formed on the second doped polysilicon layer;
first electrodes penetrating the first passivation layer to be electrically connected to the first doped polysilicon layer; and
second electrodes penetrating the second passivation layer to be electrically connected to the second doped polysilicon layer;

wherein the first doped polysilicon layer includes a plurality of first silicon grains, and surfaces of the plurality of first silicon grains form the surface of the first doped polysilicon layer having the first roughness, wherein the second doped polysilicon layer includes a plurality of second silicon grains, and surfaces of the plurality of second silicon grains form the surface of the second doped polysilicon layer having the second roughness, and wherein an average line length of the plurality of first silicon grains is less than an average line length of the plurality of second silicon grains; and wherein each of the plurality of solar cells further includes electrode regions and non-electrode regions which are alternatingly arranged, the first dielectric layer and the first doped polysilicon layer are formed in the electrode regions, and the first passivation layer is formed in the electrode regions and the non-electrode regions, wherein the first surface has first textured structures in the electrode regions, and the first dielectric layer is formed on the first textured structures, and wherein the first surface has second textured structures in the non-electrode regions, and the first passivation layer is further formed on the second textured structures.

* * * * *